United States Patent
Kim

(10) Patent No.: US 9,477,410 B2
(45) Date of Patent: Oct. 25, 2016

(54) MEMORY SYSTEM AND METHOD OF OPERATING THE MEMORY SYSTEM

(71) Applicant: Jae-hong Kim, Seoul (KR)

(72) Inventor: Jae-hong Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 7 days.

(21) Appl. No.: 14/686,483

(22) Filed: Apr. 14, 2015

(65) Prior Publication Data

US 2015/0309737 A1    Oct. 29, 2015

(30) Foreign Application Priority Data

Apr. 24, 2014  (KR) .................. 10-2014-0049461

(51) Int. Cl.
*G06F 3/06*    (2006.01)

(52) U.S. Cl.
CPC ........... *G06F 3/0611* (2013.01); *G06F 3/0625* (2013.01); *G06F 3/0659* (2013.01); *G06F 3/0688* (2013.01)

(58) Field of Classification Search
None
See application file for complete search history.

(56) References Cited

U.S. PATENT DOCUMENTS

| | | | |
|---|---|---|---|
| 8,077,518 B2 | 12/2011 | Yeung et al. | |
| 8,213,236 B1 | 7/2012 | Wu et al. | |
| 8,400,834 B2 | 3/2013 | Yeung et al. | |
| 8,422,303 B2 | 4/2013 | Franca-Neto et al. | |
| 2001/0000023 A1 | 3/2001 | Kawahara et al. | |
| 2008/0250202 A1 | 10/2008 | Conley et al. | |
| 2011/0119431 A1 | 5/2011 | Chowdhury | |
| 2013/0046917 A1 | 2/2013 | Yang et al. | |
| 2013/0111287 A1 | 5/2013 | Chao | |
| 2013/0159798 A1 | 6/2013 | Yang | |
| 2013/0194872 A1 | 8/2013 | Sim et al. | |
| 2013/0215682 A1 | 8/2013 | Yang | |

OTHER PUBLICATIONS

Byoungsung You et al., "A High Performance Co-design of 26 nm 64Gb MLC NAND FLash Memory using the Dedicated NAND Flash Controller", Journal of Semiconductor Technology and Science, vol. 11, No. 2, Jun. 2011, pp. 121-129.

*Primary Examiner* — Kevin Verbrugge
(74) *Attorney, Agent, or Firm* — Harness, Dickey & Pierce, P.L.C.

(57) ABSTRACT

According to example embodiments, a memory system includes a memory device and a memory controller configured to control the memory device. The memory device includes a plurality of memory cells. The memory controller includes a storage unit configured to sequentially store a plurality of commands received from a host, a distance determination unit configured to determine a distance between a program command and a read command, associated with the same word line, from among the plurality of commands stored in the storage unit, and a read voltage determination unit configured to determine a read voltage level corresponding to the read command based on the determined distance.

17 Claims, 20 Drawing Sheets

| PGM STATE | THRESHOLD VALUE |
|---|---|
| P1 | α |
| P2 | β |
| P3 | γ |

| PGM STATE | FIRST VOLTAGE LEVEL ( $V_{read}$ ) | SECOND VOLTAGE LEVEL ( $V_{read}'$ ) |
|---|---|---|
| P1 | 0.5 | 0.7 |
| P2 | 1 | 1.2 |
| P3 | 2 | 2.3 |

MEMORY SYSTEM AND METHOD OF OPERATING THE MEMORY SYSTEM

CROSS-REFERENCE TO RELATED APPLICATION

This application claims priority under 35 U.S.C. §119 to Korean Patent Application No. 10-2014-0049461, filed on Apr. 24, 2014, in the Korean Intellectual Property Office, the disclosure of which is included herein in its entirety by reference.

BACKGROUND

The present disclosure relates to a memory device, and more particularly, to a memory system and/or a method of operating the memory system.

A semiconductor memory device may be a nonvolatile memory device. A nonvolatile memory device may include a plurality of memory cells that retain their stored data even when power supply is interrupted. As an example of the nonvolatile memory device, a flash memory device may be used in a cellular phone, a digital camera, a personal digital assistant (PDA), a mobile computer device, a stationary computer device, and other devices.

SUMMARY

According to example embodiments of inventive concepts, a memory system includes: a memory device including a plurality of memory cells; and a memory controller configured to control the memory device. The memory controller includes a storage unit configured to sequentially store a plurality of commands received from a host. The memory controller includes a distance determination unit configured to determine a distance between a program command and a read command, associated with the same word line, from among the plurality of commands stored in the storage unit. The memory controller includes a read voltage determination unit configured to determine a read voltage level corresponding to the read command based on the determined distance.

In example embodiments, the distance determination unit may be configured to determine whether the distance between the program command and the read command with respect to the same word line exceeds a threshold value.

In example embodiments, the threshold value may be determined based on a speed at which a threshold voltage of a program-completed memory cell of the plurality of memory cells varies.

In example embodiments, a threshold voltage of a program-completed memory cell of the plurality of memory cells may decrease at a first speed during a time period between a program end time and a threshold time and may decrease at a second speed after the threshold time. The first speed may be faster than the second speed.

In example embodiments, the threshold value may be determined based on the threshold time.

In example embodiments, the read voltage determination unit may be configured to select a first voltage level as the read voltage level if the distance exceeds the threshold value, and the read voltage determination unit may be configured to select a second voltage level that is higher than the first voltage level as the read voltage level if the distance does not exceed the threshold value.

In example embodiments, the first voltage level may be used to read a memory cell when a variation in a threshold voltage of a program-completed memory cell of the plurality of memory cells is relatively small, and the second voltage level may be used to read a memory cell when a variation in a threshold voltage of a program-completed memory cell of the plurality of memory cells is relatively large.

In example embodiments, the memory system may further include a correction unit configured to correct the threshold value based on types of the plurality of commands stored in the storage unit.

In example embodiments, the correction unit may be configured to increase the threshold value according to the number of erase commands among the plurality of commands stored in the storage unit.

In example embodiments, the correction unit may be configured to decrease the threshold value according to the number of read commands among the plurality of commands stored in the storage unit.

In example embodiments, the storage unit may be configured to form a command queue configured to sequentially store the plurality of commands.

In example embodiments, the distance determination unit may be configured to estimate a first time between the program command and the read command with respect to the same word line, and the distance determination unit may be configured to determine whether the first time exceeds a threshold time.

According to example embodiments of inventive concepts, an operating method of a memory system includes: sequentially storing a plurality of commands received from a host in a storage unit; determining a distance between a program command and a read command corresponding to a first word line if the stored plurality of commands include the program command and the read command; and determining a read voltage level corresponding to the read command based on the determined distance.

In example embodiments, the determining a distance between the program command and the read command corresponding to the first word line may include: determining whether the program command corresponding to the first word line exists in the stored plurality of commands; and determining whether the distance exceeds a threshold value if it is determined that the program command exists.

In example embodiments, the determining the read voltage level corresponding to the read command based on the determined distance may include: selecting a first voltage level as the read voltage level if it is determined that the stored plurality of commands do not include the program command; selecting the first voltage level as the read voltage level if it is determined that the distance exceeds the threshold value; and selecting a second voltage level that is higher than the first voltage level as the read voltage level if it is determined that the distance does not exceed the threshold value.

According to example embodiments, a memory device includes a plurality of memory cells connected to a plurality of word lines; and a memory controller configured to control the memory device. The memory controller is configured to sequentially store a plurality of commands received from a host. The memory controller is configured to determine if the plurality of commands stored in the storage unit include a program command and a read command associated with a selected word line among the plurality of word lines. The memory controller is configured to adjust a level of a read voltage applied to the selected word line during a read operation according to an interval based on the program command and the read command. The memory controller is configured to control the application of the read voltage to the selected word line during the read operation.

In example embodiments, the memory controller may be configured to increase a magnitude of the read voltage applied to the selected word line during the read operation from a first read voltage to a second read voltage if the interval based on the program command and the read command is less than or equal to a threshold time. The memory controller may be configured to apply the first read voltage to the selected word line during the read operation if the interval based on the program command and the read command is greater than the threshold time.

In example embodiments, the memory controller may be configured to increase a magnitude of the read voltage applied to the selected word line during the read operation from a first read voltage to a second read voltage if the interval based on the program command and the read command is less than a threshold time. The memory controller may be configured to apply the first read voltage to the selected word line during the read operation if the interval based on the program command and the read command is greater than or equal to the threshold time.

In example embodiments, the memory controller may be configured to adjust the level of the read based on a program state of a selected memory connected to the selected word line, and the plurality of memory cells may include the selected cell.

In example embodiments, the plurality of memory cells may be organized as a plurality of strings. Each one of the plurality of strings may include several of the plurality of memory cells that are stacked on top of each other between at least one ground selection transistor and at least one string selection transistor.

BRIEF DESCRIPTION OF THE DRAWINGS

Features of example embodiments of inventive concepts will be more clearly understood from the following description of non-limiting example embodiments of inventive concepts, taken in conjunction with the accompanying drawings in which like reference characters refer to like parts throughout the different views. The drawings are not necessarily to scale, emphasis instead being placed upon illustrating principles of inventive concepts. In the drawings:

FIG. 11B is a multi-level cell;

DETAILED DESCRIPTION OF EXAMPLE EMBODIMENTS

Figure 1:
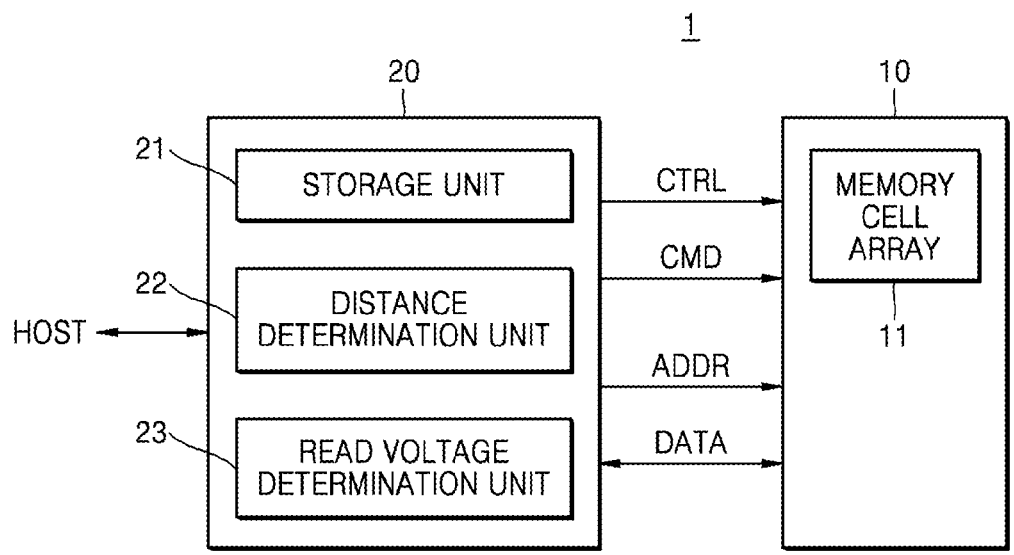
FIG. 1 is a block diagram of a memory system according to example embodiments of inventive concepts.

Example embodiments will be described in detail with reference to the accompanying drawings. Example embodiments of inventive concepts, however, may be embodied in various different forms, and should not be construed as being limited only to the to the embodiments set forth herein; Rather, these example embodiments are provided as examples so that this disclosure will be thorough and complete, and will fully convey the scope of inventive concepts to those skilled in the art. Accordingly, known processes, elements, and techniques may not be described with respect to some example embodiments of inventive concepts. Unless otherwise noted, like reference numerals denote like elements throughout the attached drawings and written description, and thus descriptions will not be repeated. In the drawings, the sizes, thicknesses and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a memory system 1 according to example embodiments of inventive concepts.

Referring to FIG. 1, a memory system 1 includes a memory device 10 and a memory controller 20. The memory device 10 includes a memory cell array 11. The memory controller 20 includes a storage unit 21, a distance determination unit 22, and a read voltage determination unit 23.

Figure 2:
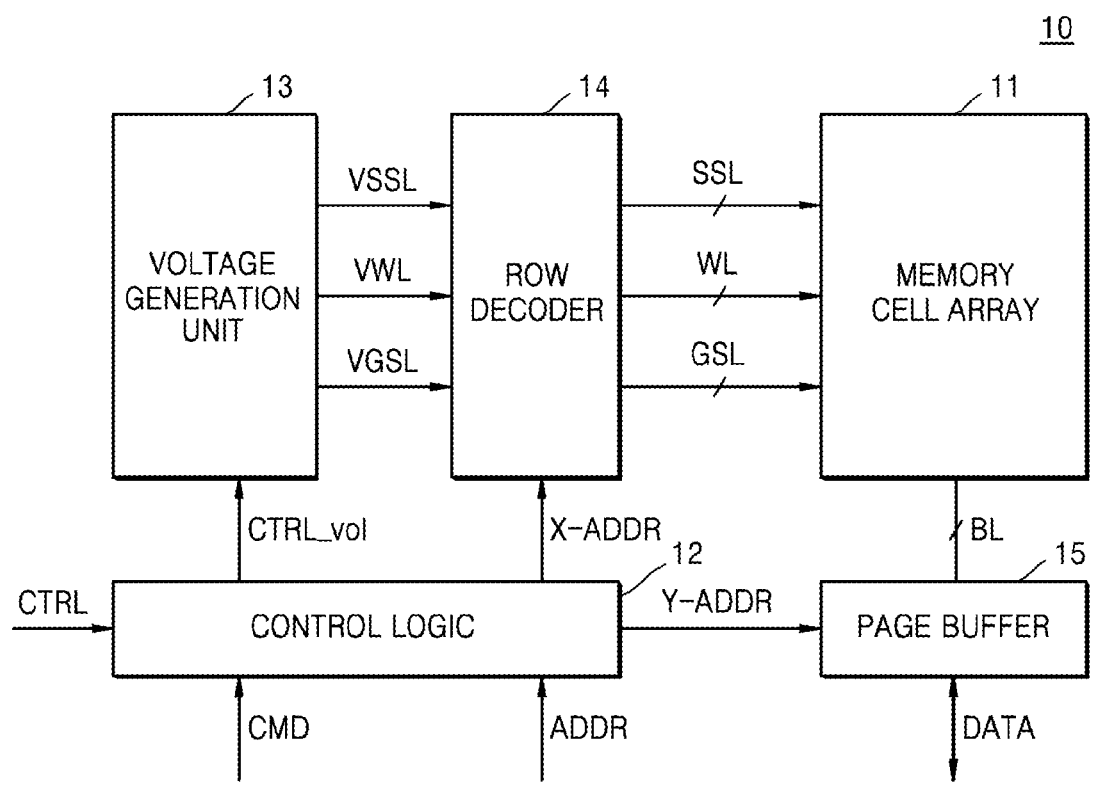
FIG. 2 is a block diagram of a memory device included in the memory system shown in FIG. 1.

Although not shown in FIG. 1, the memory cell array 11 may include a plurality of memory cells (not shown) that are arranged where a plurality of word lines WL (refer to FIG. 2) intersect a plurality of bit lines BL (refer to FIG. 2). In example embodiments, the memory cells may be flash memory cells, and the memory cell array 11 may be a NAND flash memory cell array or a NOR flash memory cell array.

Hereinafter, example embodiments of inventive concepts will be described in conjunction with an example in which the memory cells are flash memory cells. For example, the plurality of memory cells may be NAND flash memory cells (refer to FIGS. 4 to 9) that are formed to have a three-dimensional vertical NAND structure (referred to as a vertical NAND structure or a VNAND structure). Alternatively, the plurality of memory cells may be NAND flash memory cells (refer to FIG. 10) that are formed to have a two-dimensional planar NAND structure. However, example embodiments of inventive concepts are not limited to the NAND flash memory. That is, in example embodiments of inventive concepts, the plurality of memory cells may alternatively correspond to variable resistance memory cells such as resistive RAM (RRAM) cells, phase change RAM (PRAM) cells, or magnetic RAM (MRAM) cells.

The memory controller 20 performs a control operation of the memory device 10. For example, the memory controller 20 provides the memory device 10 with an address ADDR, a command CMD, and a control signal CTRL to control program, read, and erase operations of the memory device 10. Data to be programmed in the memory device 10 and data read out therefrom are transmitted and received between the memory controller 20 and the memory device 10.

The storage unit 21 sequentially stores a plurality of commands a host provides. For example, based on an input order from the host, that is, a time sequential order, the storage unit 21 stores a plurality of commands CMD. This may be referred to as a FIFO (first-in, first-out) manner. In example embodiments, the storage unit 21 may include a command queue.

In more detail, since the storage unit 21 stores a plurality of commands CMD according to an input order from the host, a difference in a storage order between two commands CMD of the plurality of commands CMD thus stored, that is, a distance (or, interval) may correspond to a difference in a processing order of the two commands CMD, that is, a distance (or, interval). This may mean that a difference in a storage order between the two commands CMD, that is, a distance may correspond to a difference in a processing order of the two commands CMD, that is, a distance. Below, a storage-order distance between two commands CMD may be referred to as a distance between the two commands CMD.

The distance determination unit 22 determines a distance D between program and read commands with respect to the same word line of the plurality of commands CMD stored in the storage unit 21. Here, the distance D may be a storage-order or a processing-order distance between a program command and a read command. In example embodiments, the storage unit 21 may include a command queue, and the distance D may correspond to a queue depth: a distance between two commands stored in the command queue.

For example, the distance determination unit 22 determines whether a distance D between program and read commands with respect to the same word line exceeds a threshold value Dth. Here, the threshold value Dth may be determined based on a speed at which a threshold voltage of a program-completed memory cell of a plurality of memory cells varies.

If the distance D between the program and read commands with respect to the same word line exceeds the threshold value Dth, the read voltage determination unit 23 determines a read voltage to have a first voltage level. Otherwise, if the distance D between the program and read commands with respect to the same word line does not exceed the threshold value Dth, the read voltage determination unit 23 determines a read voltage to have a second voltage level that is higher than the first voltage level. The read voltage determined by the distance determination unit 22 may be applied to a word line associated with a read command for reading data from at least one selected memory cell in the memory cell array 11.

The first voltage level may be a voltage level for reading a memory cell when a variation in a threshold voltage of the memory cell is relatively small and may be referred to as a normal read voltage or a default read voltage. The second voltage level may be a voltage level for reading a memory cell when a variation in a threshold voltage of the memory cell is relatively great (or, excessive) and may be referred to as a special read voltage level or a corrected read voltage level.

In example embodiments, a memory cell may be a multi-level cell (MLC), and the second voltage level, that is, the special read voltage level, may represent a set of voltages corresponding to a valley among adjacent program states of a plurality of program states. The second voltage levels, that is, the special read voltage levels may be of different offsets, as compared to the first voltage levels, that is, the normal read voltage levels.

FIG. 2 is a block diagram of a memory device 10 included in the memory system 1 shown in FIG. 1.

Referring to FIG. 2, the memory device 10 includes a memory cell array 11, control logic 12, a voltage generation unit 13, a row decoder 14, and a page buffer 15. Components of the memory device 10 will now be described.

The memory cell array 11 is connected to one or more string selection lines SSL, a plurality of word lines WL, and one or more ground selection lines GSL. The memory cell array 11 is also connected to a plurality of bit lines BL. The memory cell array 11 may include a plurality of memory cells MC (refer to FIG. 4 or 10) which are disposed at intersections of the plurality of word lines WL and the plurality of bit lines BL.

If an erase voltage Vera is applied to the memory cell array 11, a plurality of memory cells may be brought into an erase state. If a program voltage Vpgm is applied to the memory cell array 11, a plurality of memory cells may be brought into a program state. At this time, each memory cell MC may have one of an erase state E and a plurality of program states P1 to Pn that are distinguished according to a threshold voltage Vth.

Here, "n" may be a natural number of 3 or more. For example, "n" is 3 when a memory cell MC is a 2-bit-level cell. Alternatively, "n" is 7 when a memory cell MC is a 3-bit-level cell. Or, "n" is 15 when a memory cell MC is a 4-bit-level cell. Based on the above description, a plurality of memory cells MC may include multi-level cells. However, example embodiments of inventive concepts are not limited thereto. For example, the plurality of memory cells MC may include single-level cells.

Based on a command CMD, an address ADDR, and a control signal CTRL received from a memory controller 20, the control logic 12 may output a variety of control signals for allowing data to be written in the memory cell array 11 or data to be read from the memory cell array 11. Accordingly, the control logic 12 controls a variety of operations of the memory device 10 overall.

The control signals from the control logic 12 may be provided to the voltage generation unit 13, the row decoder 14, and the page buffer 15. For example, the control logic 12 provides the voltage generation unit 13 with a voltage control signal CTRL_vol, the row decoder 14 with a row address X_ADDR, and the page buffer 15 with a column address Y_ADDR.

Based on the voltage control signal CTRL_vol, the voltage generation unit 13 generates a variety of voltages for performing program, read, and erase operations with respect to the memory cell array 11. For example, the voltage generation unit 13 generates a first driving voltage VWL for driving the plurality of word lines WL, a second driving voltage VSSL for driving a plurality of string selection lines SSL, and a third driving voltage VGSL for driving a plurality of ground selection lines GSL.

In example embodiments, the first driving voltage VWL may be a program voltage (or, write voltage) Vpgm, a read voltage Vread, an erase voltage Vera, a pass voltage Vpass, or a program-verify voltage Vver. The second driving voltage may be a string selection voltage, an on voltage Von or an off voltage Voff, and the third driving voltage VGSL may be a ground selection voltage, that is, an on voltage Von or an off voltage Voff.

In example embodiments, based on the voltage control signal CTRL_vol, the voltage generation unit 13 generates a program start voltage Vstart as the program voltage Vpgm when a program loop commences, that is, when the number of program loops is 1. As the number of program loops k increases, the voltage generation unit 13 generates, as the program voltage Vpgm, a voltage that is increased by a step voltage Vstep from the program start voltage: Vstart+(k−1)*Vstep.

The row decoder 14 is connected to the memory cell array 11 via the plurality of word lines and activates some of the plurality of word lines WL in response to the row address X_ADDR from the control logic 12. For example, during a read operation, the row decoder 14 applies the read voltage Vread to a selected word line and the pass voltage Vpass to unselected word lines. During a program operation, the row decoder 14 applies the program voltage Vpgm to the selected word line and the pass voltage Vpass to the unselected word lines.

The page buffer 15 is connected to the memory cell array 11 via the plurality of bit lines BL. For example, during a read operation, the page buffer 15 acts as a sense amplifier and outputs data stored in the memory cell array 11. During a program operation, the page buffer 15 acts as a write driver and writes data to be stored in the memory cell array 11.

Figure 3:
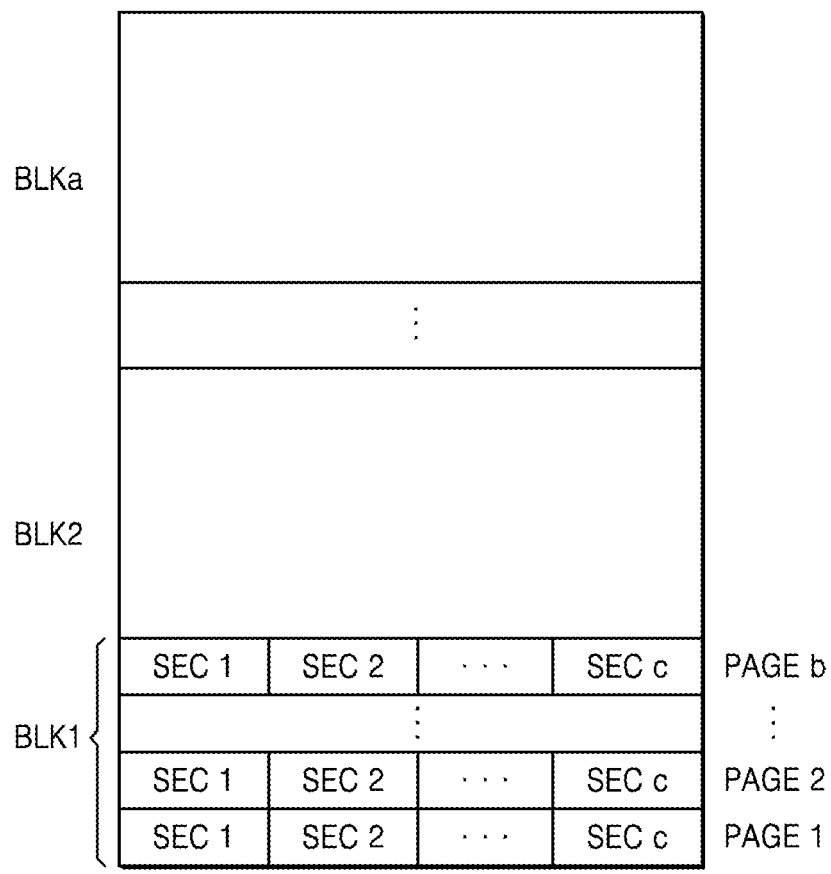
FIG. 3 is a diagram of a memory cell array of a memory device shown in FIG. 1, according to example embodiments of inventive concepts.

FIG. 3 is a diagram of a memory cell array 11 of the memory device 10 shown in FIG. 1, according to example embodiments of inventive concepts.

Referring to FIG. 3, the memory cell array 11 may be a flash memory cell array. The memory cell array 11 includes a plurality of memory blocks BLK1 to BLKa (a being an integer more than 2), each of which has a plurality of pages PAGE1 to PAGEb (b being an integer more than 2). Each of the pages PAGE1 to PAGEb has a plurality of sectors SEC1 to SECc (c being an integer more than 2). For the sake of easier understanding, pages PAGE1 to PAGEb and sectors SEC1 to SECc of the memory block BLK1 are illustrated in FIG. 3. However, the other memory blocks BLK2 to BLKa may also have substantially the same configuration as the memory block BLK1.

Figure 4:
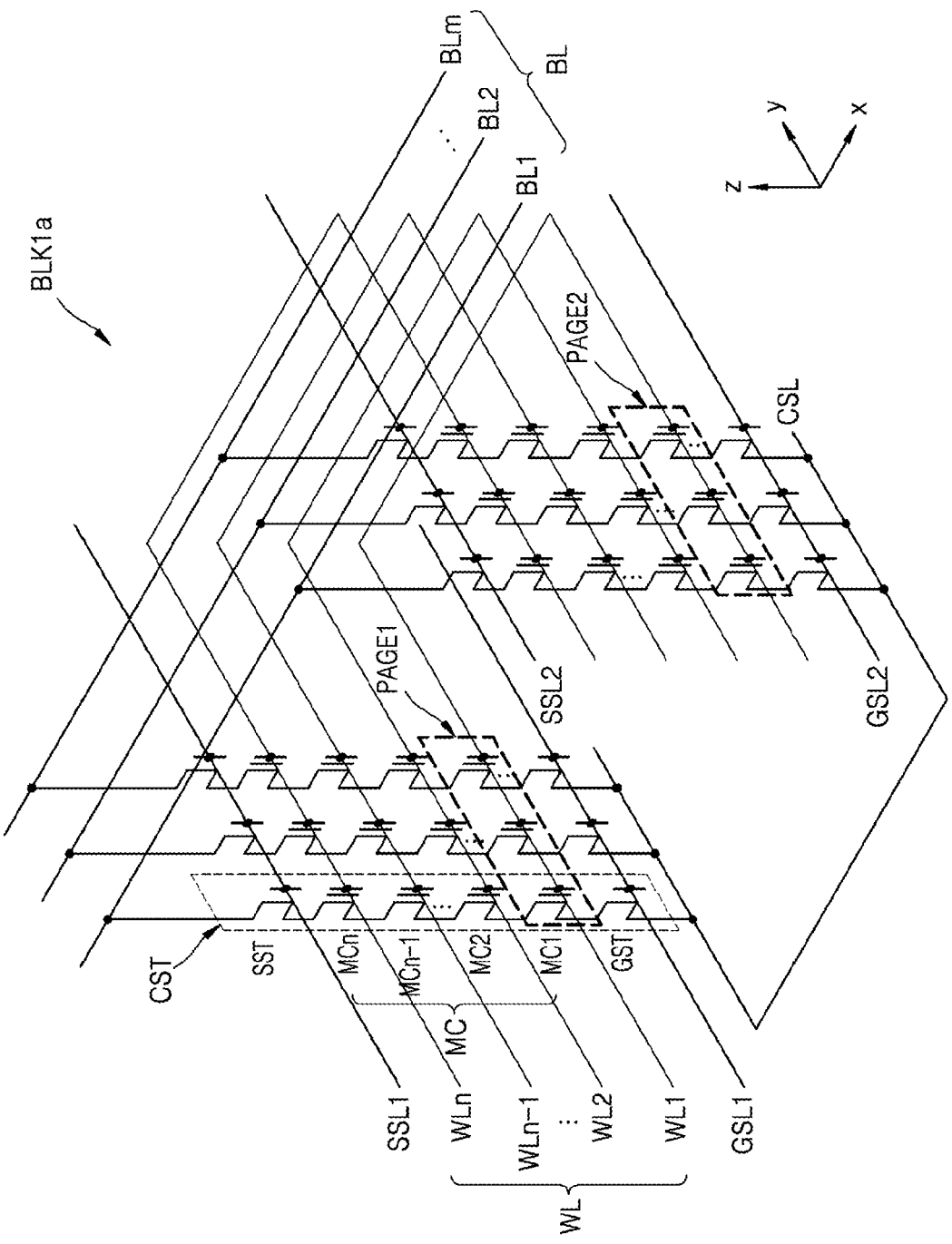
FIG. 4 is a circuit diagram of a first memory block of a memory cell array shown in FIG. 3, according to example embodiments of inventive concepts.

FIG. 4 is a circuit diagram of a first memory block BLK1a of the memory cell array 11 shown in FIG. 3, according to example embodiments of inventive concepts.

Referring to FIG. 4, the first memory block BLK1a may be a part of a vertical NAND flash memory. In this case, each of the memory blocks BLK1 to BLKa shown in FIG. 3 may be realized to have the same configuration as shown in FIG. 4. In FIG. 4, a first direction, a second direction, and a third direction may be referred as to an x-direction, a y-direction, and a z-direction, respectively. However, example embodiments of inventive concepts are not limited thereto. The first to third directions may be changed.

The first memory block BLK1a has a plurality of cell strings CST, a plurality of word lines WL, a plurality of bit lines BL, a plurality of ground selection lines GSL1 and GSL2, a plurality of string selection lines SSL1 and SSL2, and a common source line CSL. Here, the number of cell strings CST, the number of word lines WL, the number of ground selection lines GSL1 and GSL2, and the number of string selection lines SSL1 and SSL2 may be variously changed.

Each cell string CST includes a string selection transistor SST, a plurality of memory cells MC, and a ground selection transistor GST that are connected in series between one of the bit lines BL and the common source line CSL. However, example embodiments of inventive concepts are not limited thereto. For example, each cell string CST may further include at least one dummy cell. In example embodiments, each cell string CST may include at least two string selection transistors and/or at least two ground selection transistors.

The cell strings CST may extend in the third direction (z-direction). For example, the cell strings CST may extend in a direction (z-direction) perpendicular to a substrate 110 (refer to FIG. 5). For this reason, the memory block BLK1a, including the cell strings CST, may be called "a vertical NAND flash memory". Since the cell strings CST extend in a direction (z-direction) perpendicular to the substrate 110, the integration density of the memory cell array 11 may be improved.

The plurality of word lines WL extend in the first direction (x-direction) and second direction (y-direction), and each word line WL is connected to a plurality of memory cells MC. The memory cells MC that are arranged adjacent to each other along the first and second directions x and y may be connected to the same word line WL. For example, each word line WL is connected to a gate of a memory cell to control the memory cell. A plurality of memory cells MC may store data and may be erased, programmed, or read according to a control of a word line connected thereto.

The plurality of bit lines BL extend in the first direction (x-direction) and are connected to the string selection transistors SST. A plurality of string selection transistors SST that are arranged adjacent to each other along the first direction (x-direction) may be connected to the same word line. For example, each bit line BL is connected to a drain of a string selection transistor SST.

The plurality of string selection lines SSL1 and SSL2 extend in the second direction (y-direction) and are connected to the string selection transistors SST. A plurality of string selection transistors SST that are arranged adjacent to each other along the second direction (y-direction) may be connected to the same string selection line SSL1 or SSL2. For example, each string selection line SSL1 or SSL2 is connected to a gate of the string selection transistor SST to control the string selection transistor SST.

The plurality of ground selection lines GSL1 and GSL2 extend in the second direction (y-direction) and are connected to ground selection transistors GST. A plurality of ground selection transistors GST that are arranged adjacent to each other along the second direction (y-direction) may be connected to the same ground selection line GSL1 or GSL2. For example, each ground selection line GSL1 or GSL2 is connected to a gate of the ground selection transistor GST to control the ground selection transistor GST.

The ground selection transistors GST of cell strings CST are connected in common to the common source line CSL. For example, the common source line CSL is connected to a source of the ground selection transistor GST.

Here, a plurality of memory cells MC that are arranged adjacent to each other along the second direction (y-direction) and are connected in common to the same word line WL and the same string selection line SSL1 or SSL2 may be referred to as a page. For example, a plurality of memory cells MC that are arranged adjacent to each other along the second direction (y-direction) and are connected in common to a first word line WL1 and to a first string selection line SSL1 may be referred to as a first page PAGE1. A plurality of memory cells MC that are arranged adjacent to each other along the second direction (y-direction) and are connected in common to the first word line WL1 and to a second string selection line SSL2 may be referred to as a second page PAGE2.

To program memory cells MC, 0 V is applied to a bit line BL, an on voltage Von to a string selection line SSL, and an off voltage Voff to a ground selection line GSL. The on voltage Von may be equal to or greater than a threshold voltage of a string selection transistor SST to turn on the string selection transistor SST. The off voltage Voff may be less than a threshold voltage of a ground selection transistor GST to turn on the ground selection transistor GST. Also, a program voltage Vpgm is applied to a selected memory cell of memory cells and a pass voltage Vpass is applied to the remaining memory cells. When the program voltage Vpgm is applied to the selected memory cell, charges are injected in memory cells MC through F-N tunneling. The pass voltage Vpass may be higher than threshold voltages of memory cells MC. The program voltage Vpgm may be applied to a selected word line (among the word lines WL) that is connected to the selected memory cell of the memory cells. The pass voltage Vpass may be applied to unselected word lines (among the word lines WL) that are connected to the remaining memory cells.

To erase memory cells MC at the same time, an erase voltage Verase is applied to bodies of the memory cells MC and 0 V is applied to word lines WL.

Figure 5:
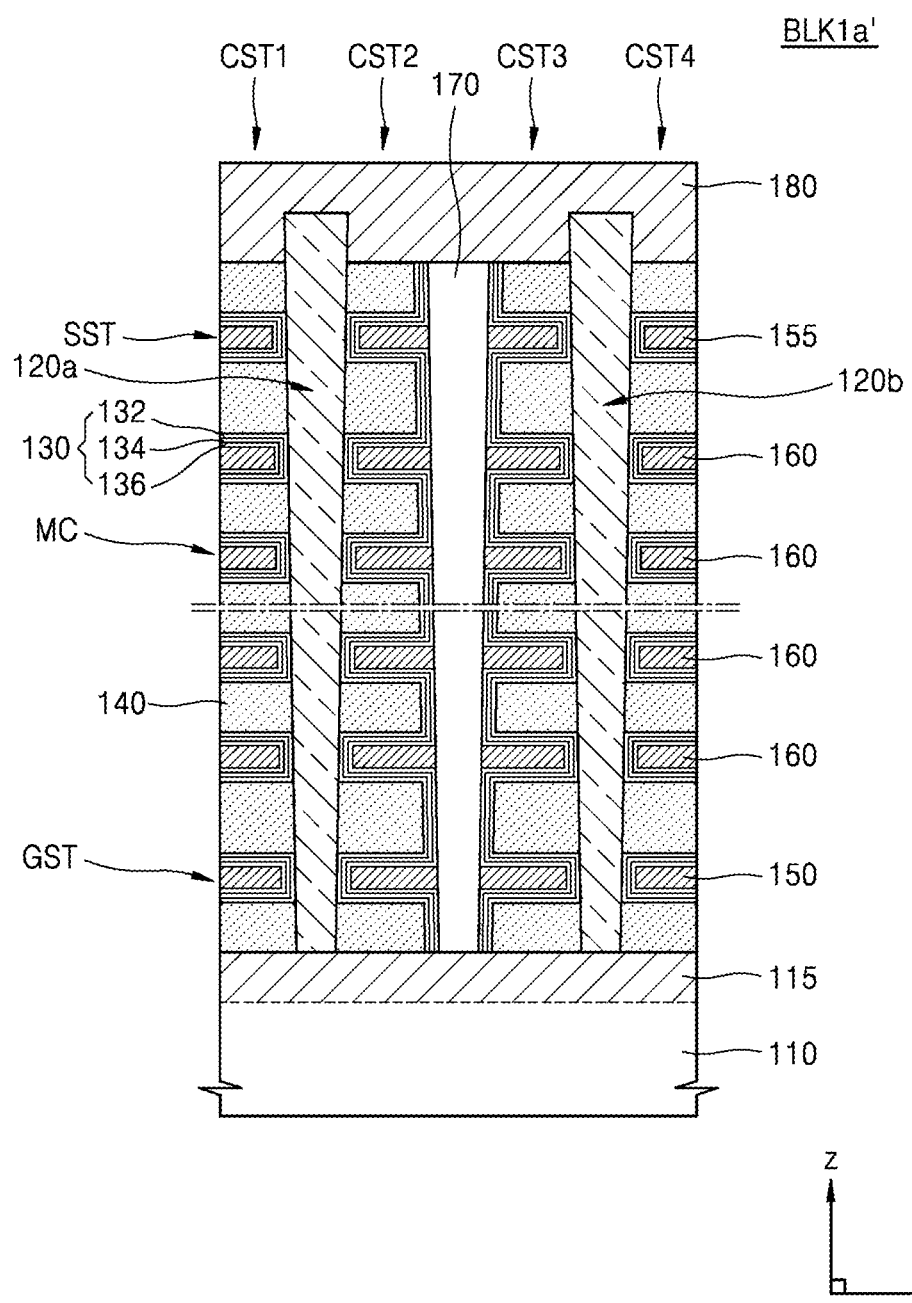
FIG. 5 is a cross-sectional view of a first memory block of FIG. 4 taken along a bit line direction, according to example embodiments of inventive concepts.
Figure 6:
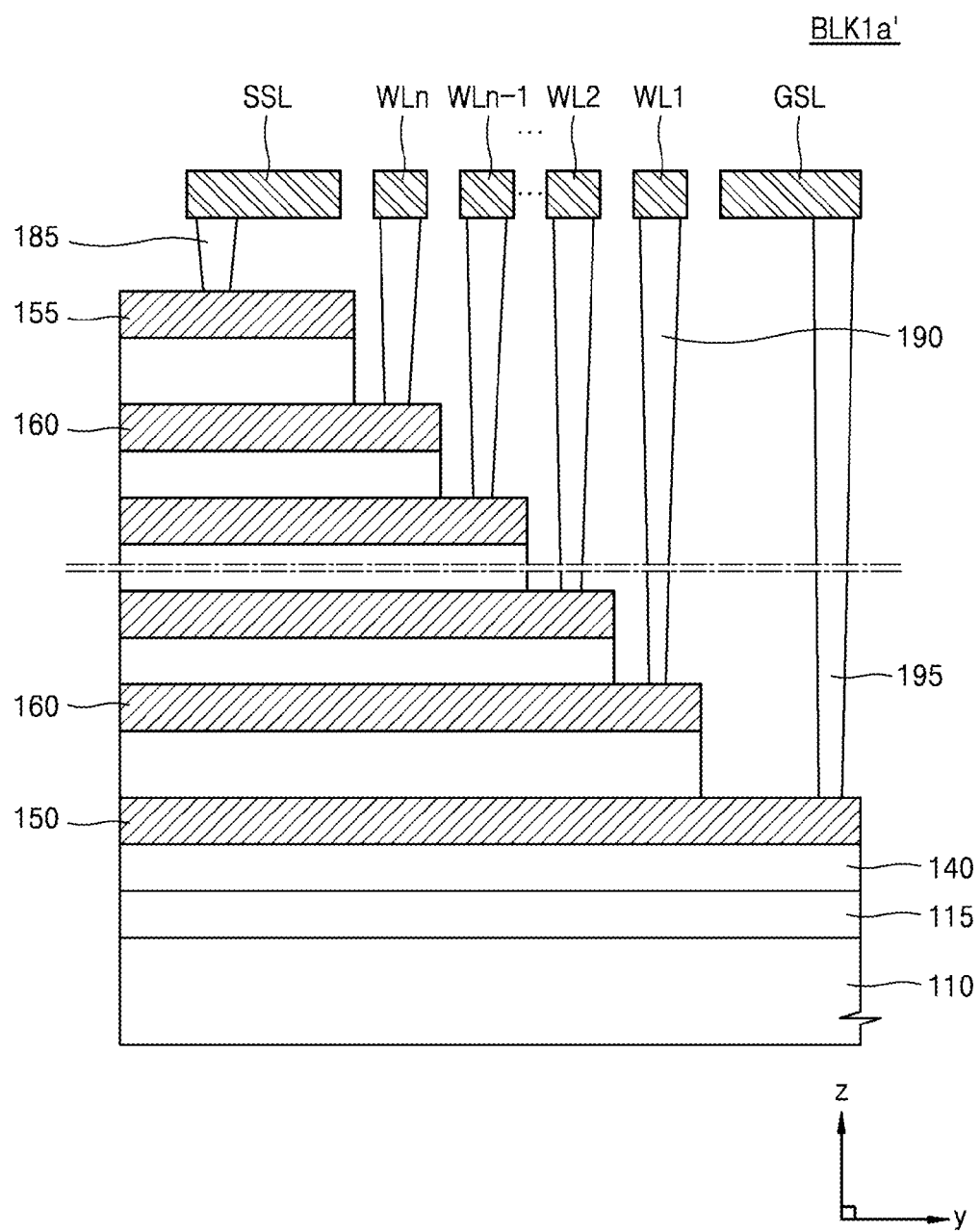
FIG. 6 is a cross-sectional view of a first memory block of FIG. 4 taken along a word line direction, according to example embodiments of inventive concepts.

FIG. 5 is a cross-sectional view taken along a bit line direction of an example BLK1a' of the first memory block BLK1a of FIG. 4, according to example embodiments of inventive concepts. FIG. 6 is a cross-sectional view taken along a word line direction of the example BLK1a' of the first memory block BLK1a of FIG. 4.

Referring to FIGS. 5 and 6, the first memory block BLK1a' has a substrate 110 that has a main surface extending in a first direction (x-direction). The substrate 110 may include a semiconductor material, for example, a group IV semiconductor, a group III-V compound semiconductor, or a group III-V compound semiconductor. For example, the group IV semiconductor may include silicon, germanium, or silicon-germanium. In this case, the substrate 110 may be a bulk wafer or may be implemented with an epitaxial layer.

Semiconductor pillars 120a and 120b are arranged on the substrate 110 to extend in a direction perpendicular to the substrate 110. The semiconductor pillars 120a and 120b may include a semiconductor material such as polysilicon or single crystal silicon, and the semiconductor material may not be doped or may include p-type or n-type impurities.

The substrate 110 includes an impurity area 115 under the semiconductor pillars 120a and 120b. The impurity area 115 may be a source region or may form a PN junction with another region of the substrate 110. A common source line CSL shown in FIG. 4 may be connected with the impurity area 115. Or, the impurity area 115 may be formed to be restricted under the semiconductor pillars 120a and 120b.

Each of memory cells MC includes a storage medium 130 on a sidewall of each semiconductor pillar 120a/120b and a control gate electrode 160 on the storage medium 130. The storage medium 130 includes a tunneling insulation layer 132, a charge storage layer 134, and a blocking insulation layer 136 that are sequentially stacked on a sidewall of each semiconductor pillar 120a/120b.

The charge storage layer 134 may have a charge storage capacity. For example, the charge storage layer 134 is of a trap-type, and may include a silicon nitride layer, quantum dots, or nanocrystals, for example. The quantum dots or nanocrystals may be formed of a conductor (e.g., metal) or fine particles of a semiconductor. The tunneling insulation layer 132 and the blocking insulation layer 136 may include an oxide film, a nitride film, or a high-k dielectric constant film. The high-k dielectric constant film may mean a dielectric film that has a dielectric constant that is higher than the oxide film and/or the nitride film.

A string selection transistor SST includes a string selection gate electrode 155 on a sidewall of the semiconductor pillar 120a/120b. The string selection transistor SST may be connected to a bit line 180. The bit line 180 may be formed in a line shape of a pattern that extends along the first direction (x-direction). A ground selection transistor GST includes a ground selection gate electrode 150 on a sidewall of the semiconductor pillar 120a/120b.

The storage medium 130 between a string selection transistor SST and the semiconductor pillar 120a/120b and between the ground selection transistor GST and the semiconductor pillars 120a/120b may serve as a gate insulation layer. Thus, the storage medium 130 may be replaced with one insulation layer. Interlayer insulation layers 140 are interposed between the ground selection gate electrode 150, control gate electrodes 160, and string selection gate electrodes 155. The storage medium 130 may extend along surfaces of the interlayer insulation layers 140. The interlayer insulating layers 140 may be formed of silicon dioxide, but example embodiments are not limited thereto.

First and second cell strings CST1 and CST2 are disposed adjacent to each other with the semiconductor pillar 120a interposed therebetween, and third and fourth cell strings CST3 and CST4 are disposed adjacent to each other with the semiconductor pillar 120b interposed therebetween. An insulation layer 170 is disposed between the second and third cell transistors CST2 and CST3. The insulation layer 170 may be formed of an insulating material such as silicon dioxide or silicon nitride, but example embodiments are not limited thereto.

The string selection gate electrode 155 is connected to the string selection line SSL via a contact plug 185. The control gate electrodes 160 are connected to word lines WL1 to WLn via contact plugs 190. The ground selection gate electrode 150 is connected to a ground selection line GSL via contact plugs 195.

Figure 7:
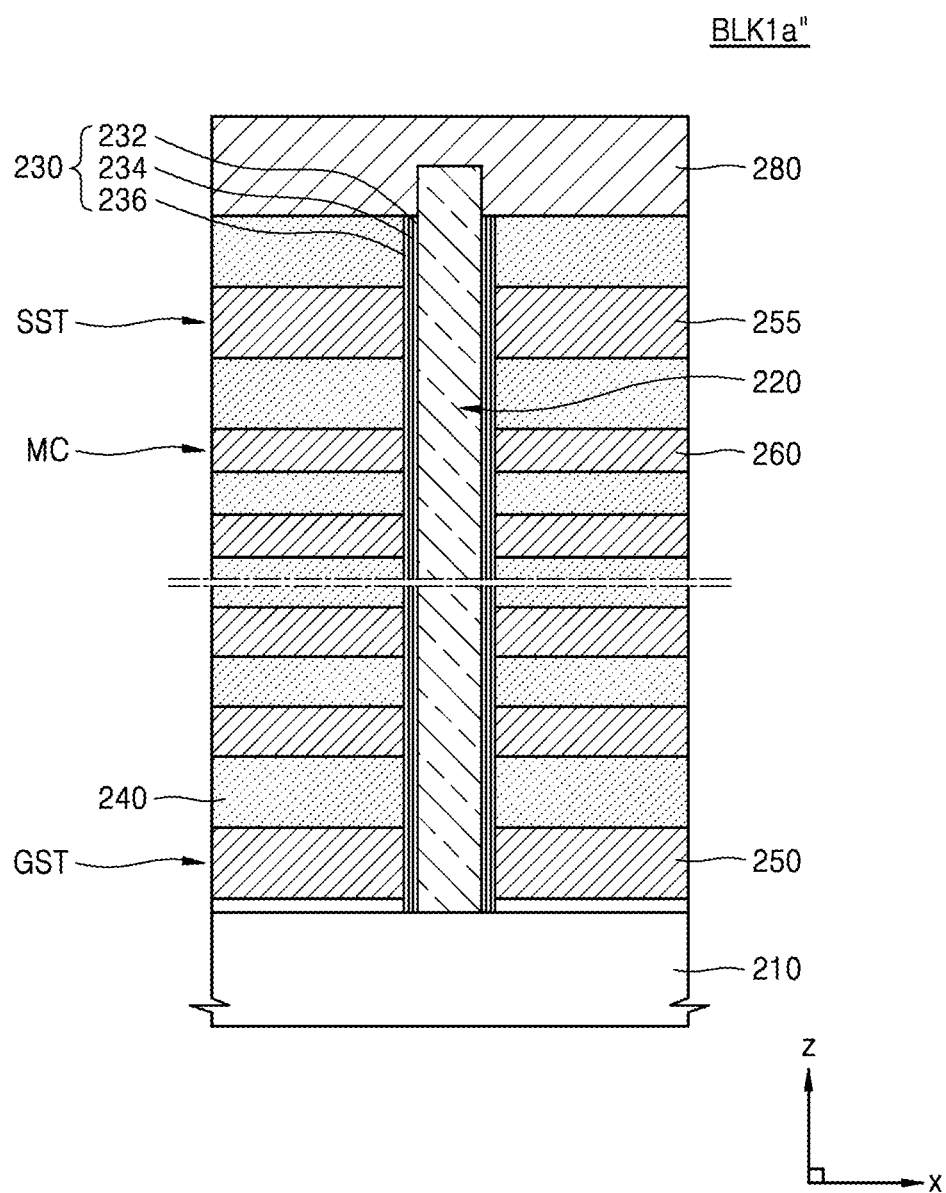
FIG. 7 is a cross-sectional view of a first memory block of FIG. 4 taken along a bit line direction, according to example embodiments of inventive concepts.

FIG. 7 is a cross-sectional view taken along a bit line direction of another example BLK1a" of the first memory block BLK1a of FIG. 4.

Referring to FIG. 7, the first memory block BLK1a" has a substrate 210 that has a main surface extending in a first direction (x-direction). The substrate 210 may include a semiconductor material, for example, a group IV semiconductor, a group III-V compound semiconductor, or a group III-V compound semiconductor. For example, the group IV semiconductor may include silicon, germanium, or silicon-germanium. In this case, the substrate 210 may be a bulk wafer or may be implemented with an epitaxial layer.

A semiconductor pillar 220 is arranged on the substrate 210 to extend in a direction perpendicular to the substrate 210. The semiconductor pillar 210 may include a semiconductor material such as polysilicon or single crystal silicon, and the semiconductor material may not be doped or may include p-type or n-type impurities.

A storage medium 230 may be formed to extend along a length direction of the semiconductor pillar 220. The storage medium 230 includes a tunneling insulation layer 232, a charge storage layer 234, and a blocking insulation layer 236 that are sequentially stacked on a sidewall of the semiconductor pillar 220.

A string selection transistor SST includes a string selection gate electrode 255 on a sidewall of the semiconductor pillar 220. The string selection transistor SST may be connected to a bit line 280. The bit line 280 may be formed of a line shape of a pattern that extends along the first direction (x-direction). A ground selection transistor GST includes a ground selection gate electrode 250 on a sidewall of the semiconductor pillar 220.

The storage medium 230 between the string selection transistor SST and the semiconductor pillar 220 and between the ground selection transistor GST and the semiconductor pillars 220 may serve as a gate insulation layer. Thus, the storage medium 230 may be replaced with one insulation layer. Interlayer insulation layers 240 are interposed between the ground selection gate electrode 250, control gate electrodes 260, and the string selection gate electrodes 255.

Figure 8:
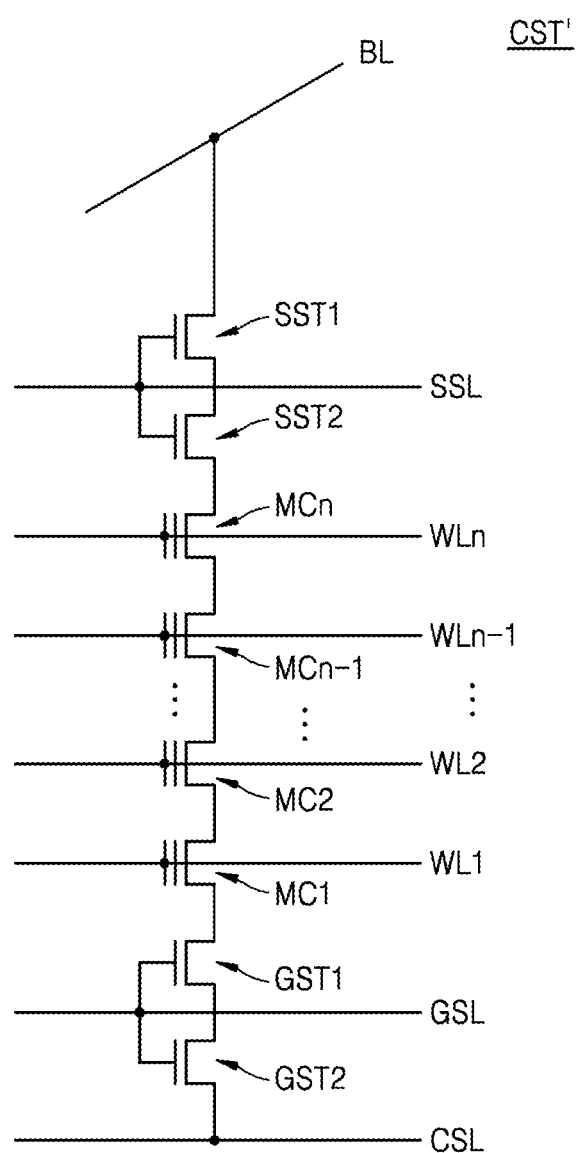
FIG. 8 is a circuit diagram of a cell string included in the first memory block shown in FIG. 4, according to example embodiments of inventive concepts.

FIG. 8 is a circuit diagram of a cell string CST' included in the first memory block shown BLK1a in FIG. 4, according to example embodiments of inventive concepts.

Referring to FIG. 8, a cell string CST' includes at least one pair of string selection transistors SST1 and SST2, a plurality of memory cells MC, and at least one pair of ground selection transistors GST1 and GST2. A bit line BL is connected to one end of the cell string CST', and a common source line CSL is connected to the other end of the cell string CST'.

Some elements included in the cell string CST' according to example embodiments of inventive concepts may be substantially the same as those included in a cell string CST shown in FIG. 4. The same elements are marked by the same reference numerals, and a description thereof is thus omitted. A difference between the cell string CST shown in FIG. 4 and the cell string CST' according to example embodiments of inventive concepts will now be described.

The plurality of memory cells MC are disposed vertically in series. The memory cells MC may store data. A plurality of word lines WL are connected to the memory cells MC to control the memory cells MC. The number of memory cells MC may be changed according to a capacity of a nonvolatile memory device.

The string selection transistors SST1 and SST2 are disposed adjacent to each other at one side of the memory cells MC. For example, the string selection transistors SST1 and SST2 are disposed between the bit line BL and a memory cell MCn and are connected in series to the memory cell MCn. The string selection transistors SST1 and SST2 control a signal transfer between the bit line BL and the memory cells MC. A string selection line SSL is connected in common to the string selection transistors SST1 and SST2. Thus, the string selection transistors SST1 and SST2 may operate as a single transistor.

The ground selection transistors GST1 and GST2 may be arranged opposite to the string selection transistors SST1 and SST2, that is, at the other side of the memory cells MC. For example, the ground selection transistors GST1 and GST2 are disposed between the common source line CSL and a memory cell MC1 and are connected in series to the memory cell MC1. The ground selection transistors GST1 and GST2 control a signal transfer between the common source line CSL and the memory cells MC. A ground selection line GSL is connected in common to the ground selection transistors GST1 and GST2. Thus, the ground selection transistors GST1 and GST2 may operate as a single transistor.

Based on example embodiments of inventive concepts, a length of each of string selection gate electrodes 155 (refer to FIG. 5) when each cell string CST' includes two or more string selection transistors SST1 and SST2 is shorter than that when each cell string CST' includes one string selection transistor, thereby making it possible to fill a gap among interlayer insulation layers 140 (refer to FIG. 5) without voids. Likewise, a length of each of ground selection gate electrodes 150 (refer to FIG. 5) when each cell string CST' includes two or more ground selection transistors GST1 and GST2 is shorter than that when each cell string includes one string selection transistor, thereby making it possible to fill a gap among the interlayer insulation layers 140 (refer to FIG. 5) without voids.

Figure 9:
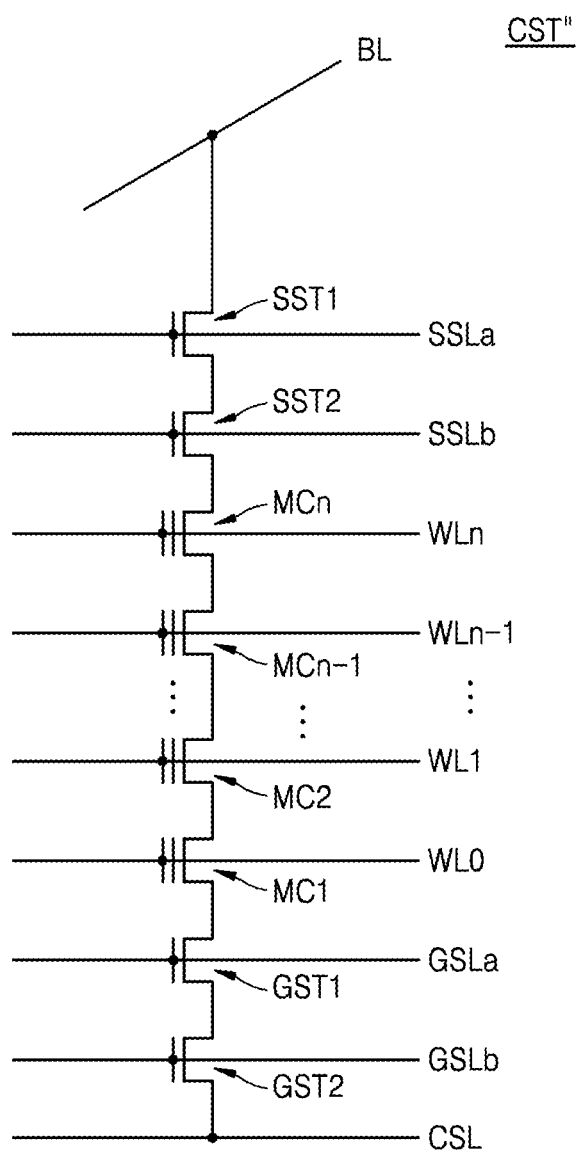
FIG. 9 is a circuit diagram of a cell string included in the first memory block shown in FIG. 4, according to example embodiments of inventive concepts.

FIG. 9 is a circuit diagram of a cell string CST" included in the first memory block BLK1a shown in FIG. 4, according to example embodiments of inventive concepts.

Referring to FIG. 9, the cell string CST" includes at least one pair of string selection transistors SST1 and SST2, a plurality of memory cells MC, and at least one pair of ground selection transistors GST1 and GST2. A bit line BL is connected to one end of the cell string CST", and a common source line CSL is connected to the other end of the cell string CST".

Some elements included in the cell string CST" according to example embodiments of inventive concepts may be substantially the same as those included in the cell string CST' shown in FIG. 8. The same elements are marked by the same reference numerals, and a description thereof is thus omitted. A difference between the cell string CST' shown in FIG. 8 and the cell string CST" according to example embodiments of inventive concepts will now be described.

The string selection transistors SST1 and SST2 are disposed adjacent to each other at one side of the memory cells MC. For example, the string selection transistors SST1 and SST2 are disposed between the bit line BL and a memory cell MCn and are connected in series to the memory cell MCn. The string selection transistors SST1 and SST2 control a signal transfer between the bit line BL and the memory cells MC. A first string selection line SSLa is connected to the string selection transistor SST1, and a second string selection line SSLb is connected to the string selection transistor SST2.

The ground selection transistors GST1 and GST2 may be arranged opposite to the string selection transistors SST1 and SST2, that is, at the other side of the memory cells MC. For example, the ground selection transistors GST1 and GST2 are disposed between the common source line CSL and a memory cell MC1 and are connected in series to the memory cell MC1. The ground selection transistors GST1 and GST2 control a signal transfer between the common source line CSL and the memory cells MC. A first ground selection line GSLa is connected to the ground selection transistor GST1, and a second ground selection line GSLb is connected to the ground selection transistor GST2.

Figure 10:
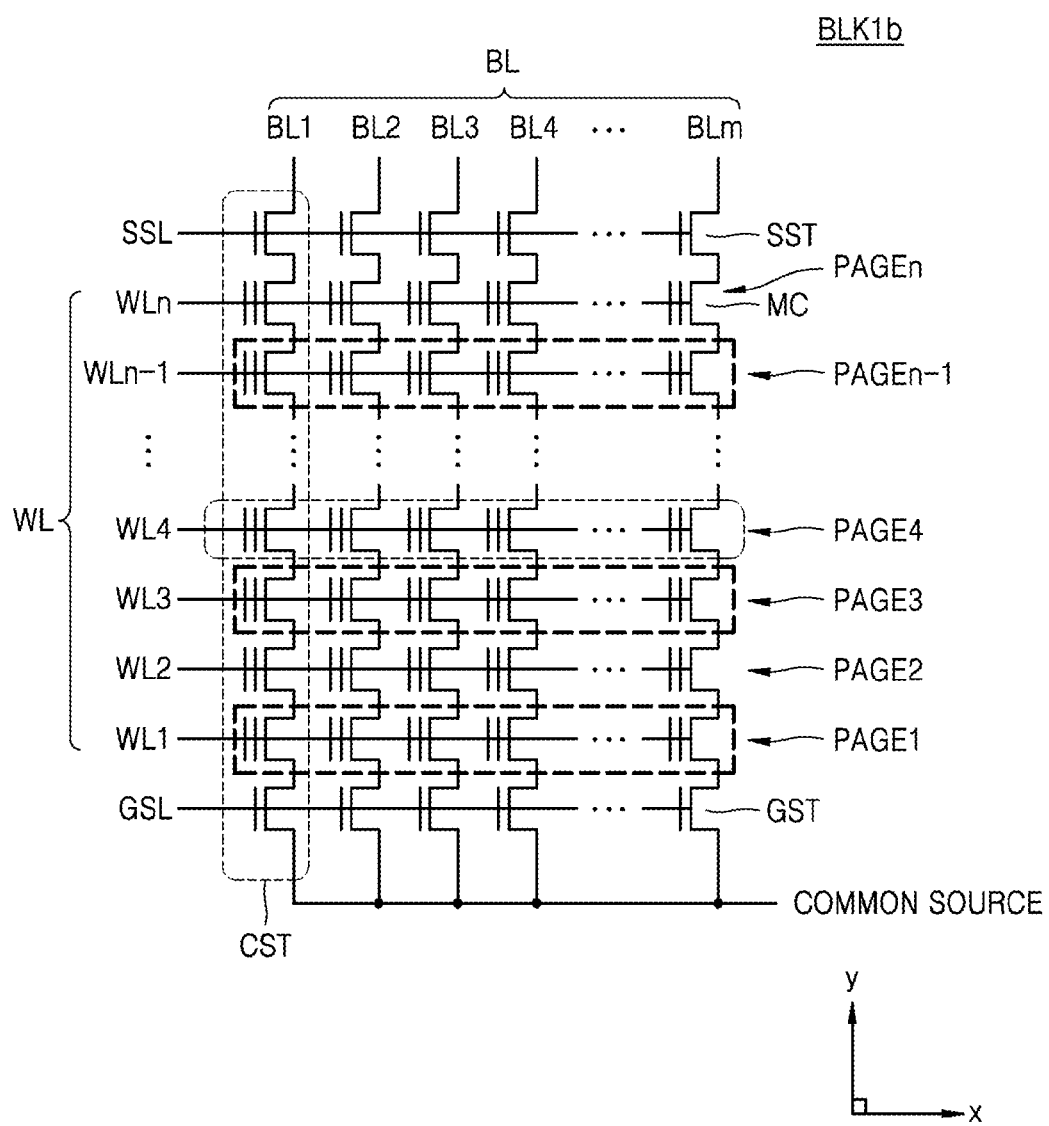
FIG. 10 is a circuit diagram of a first memory block included in a memory cell array shown in FIG. 3, according to example embodiments of inventive concepts.

FIG. 10 is a circuit diagram of a first memory block BLK1b included in a memory cell array shown in FIG. 3, according to example embodiments of inventive concepts.

Referring to FIG. 10, the first memory block BLK1b may be a part of a vertical NAND flash memory. In this case, memory blocks BLK1 to BLKa shown in FIG. 3 may be implemented the same as shown in FIG. 10. In FIG. 10, a first direction, a second direction, and a third direction may be referred as to an x-direction, a y-direction, and a z-direction, respectively. However, example embodiments of inventive concepts are not limited thereto. The first and second directions may be changed.

The first memory block BLK1b includes a plurality of cell strings CST, a plurality of word lines WL, a plurality of bit lines BL, a ground selection line GSL, a string selection line SSL, and a common source line CSL. Here, the number of cell strings CST, the number of word lines WL, and the number of bit lines BL may be variously changed.

The cell string CST includes a string selection transistor SST, a plurality of memory cells MC, and a ground selection transistor GST that are connected in series between a bit line BL and a common source line CSL. However, example embodiments of inventive concepts are not limited thereto. For example, the cell string CST may further include at least one dummy cell.

A NAND flash memory device with a structure shown in FIG. 10 performs an erase operation by blocks and a program operation by pages. Here, a page may correspond to each of the word lines WL1 to WLn.

Figure 11A:
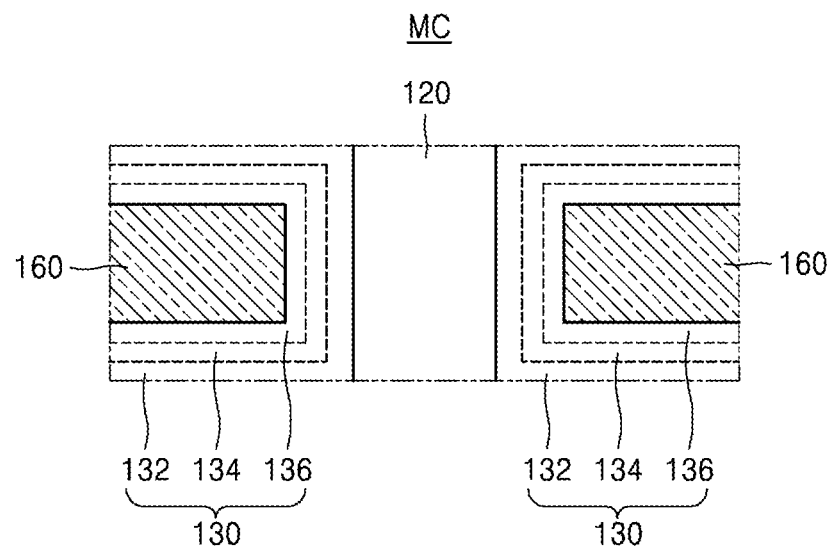
FIG. 11A is a cross-sectional view of a memory cell included in the first memory block shown in FIG. 4, according to example embodiments of inventive concepts.

FIG. 11A is a cross-sectional view of a memory cell included in the first memory block shown in FIG. 4, according to example embodiments of inventive concepts.

Referring to FIG. 11A, a portion of the pillar 120 (see 120a/120b in FIG. 5) may function as a channel region of the memory cell MC. The control gate electrode 160 may function as a control gate of the memory cell MC. In the portion of the storage medium 130 that extends between the pillar 120 and the control gate electrode 160, the charge storage layer 134 may function as a floating gate of the memory cell MC. The tunneling insulating layer 132 is between the pillar 120 and the charge storage layer 134. The blocking insulation layer 134 is between the control gate electrode 160 and the charge storage layer 134. A drain contact may be between a top of the pillar 120 and a bottom of the bit line 180 to provide a drain of the memory cell. A bottom of the pillar 120 may be connected to a common source line CSL through the impurity area 115. Voltages needed to program, erase, and read memory cells MC may be applied to the pillar 120 through the bit line, the control gate of the memory cell MC through the control gate electrode 160, the source of the memory cell through the impurity area 115.

Figure 11B:
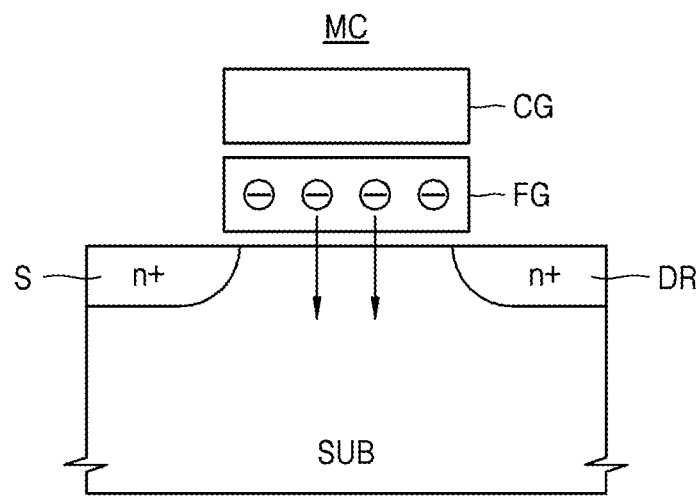
FIG. 11B is a cross-sectional view of a memory cell included in the first memory block shown in FIG. 10, according to example embodiments of inventive concepts.

FIG. 11B is a cross-sectional view of a memory cell included in the first memory block shown in FIG. 10, according to example embodiments of inventive concepts.

Referring to FIG. 11B, a source S and a drain DR are formed in a substrate SUB. A channel region is formed between the source S and the drain DR. A floating gate FG is formed above the channel region, and an insulation layer such as a tunneling insulation layer is disposed between the channel region and the floating gate FG. A control gate CG is formed above the floating gate FG, and an insulation layer such as a block insulation layer is disposed between the floating gate FG and the control gate CG. Voltages needed to program, erase, and read memory cells MC may be applied to the substrate SUB, the source S, the drain DR, and the control gate CG, respectively.

In a flash memory device, data stored in a memory cell MC is read out by determining a threshold voltage Vth of the memory cell MC. The threshold voltage Vth of the memory cell MC may be determined according to the amount of electrons stored in the floating gate FG. For example, a threshold voltage of a memory cell MC may increase in proportion to an increase in the number of electrons stored in the floating gate FG. Electrons stored in the floating gate FG of the memory cell MC may be leaked in an arrow direction due to diverse causes, thereby causing a change in a threshold voltage of the memory cell MC.

Figure 12A:
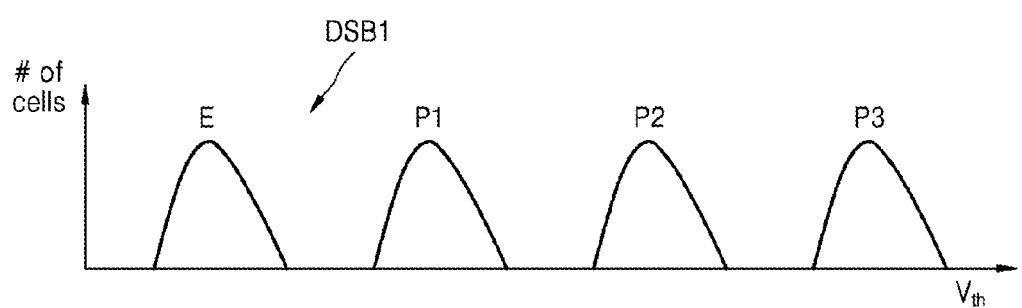
FIG. 12A is a graph DSB1 schematically illustrating a threshold voltage distribution formed after a program operation of a memory device, when a memory cell shown in FIG. 11A

FIG. 12A is a graph DSB1 schematically illustrating a threshold voltage distribution formed after a program operation of a memory device 10, when the memory cell MC shown in FIG. 11A or FIG. 11B is a multi-level cell.

Referring to FIG. 12A, the abscissa represents a threshold voltage Vth, and the ordinate represents the number of memory cells MC. If a memory cell MC is a 2-bit multi-level cell storing 2-bit data, the memory cell MC may have one of an erase state E, a first program state P1, a second program state P2, and a third program state P3. As gap between threshold voltage distributions in a multi-level cell may be narrower than that in a single-level cell, a read error may occur though a variation in a threshold voltage of the multi-level cell is small.

Figure 12B:
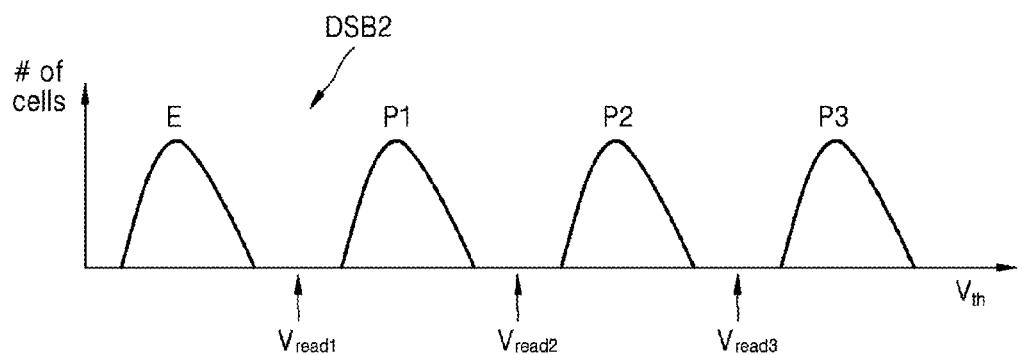
FIG. 12B is a graph DSB2 schematically illustrating a change in a threshold voltage distribution shown in FIG. 12A in the case a time elapses after a program operation of a memory device has ended.

FIG. 12B is a graph DSB2 schematically illustrating a change in a threshold voltage distribution shown in FIG. 12A in the case a time elapses after a program operation of a memory device has ended.

Referring to FIG. 12B, threshold voltages of memory cells MC respectively programmed to have any one of an erase state E and first to third program states P1 to P3 may form a distribution changed as illustrated in FIG. 12B. As can be seen from the graph DSB2 shown in FIG. 12B, threshold voltages of memory cells MC may decrease overall, as compared to the graph DSB1 shown in FIG. 12A.

A first read voltage Vread1 may have a voltage level between a distribution of memory cells MC each having an erase state E and a distribution of memory cells MC each having a first program state P1. A second read voltage Vread2 may have a voltage level between a distribution of memory cells MC each having the first program state P1 and a distribution of memory cells MC each having a second program state P2. A third read voltage Vread3 may have a voltage level between a distribution of memory cells MC each having the second program state P2 and a distribution of memory cells MC each having a third program state P3.

For example, when the first read voltage Vread1 is applied to a control gate CG of a memory cell MC, a memory cell MC with the erase state E is turned on and a memory cell MC with the first program state P1 is turned off. A current flows via the turned-on memory cell MC, but a current does not flow via the turned-off memory cell MC. Data stored in a memory cell MC may be determined according to whether or not the memory cell MC is turned on.

The first to third read voltages Vread1 to Vread3 may be referred to as a normal or default read voltage. In this specification, the first to third read voltages Vread1 to Vread3 may be referred to as a first voltage level Vread. The first voltage level Vread may be a voltage level for reading memory cells when a variation in a threshold voltage of a memory cell is relatively small.

Figure 13:
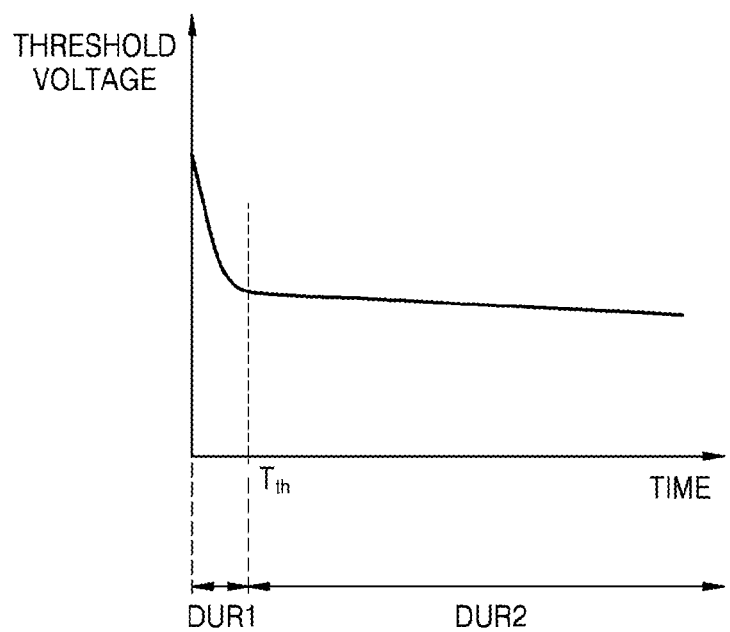
FIG. 13 is a graph schematically illustrating a variation in a threshold voltage of a memory cell shown in FIG. 11A or FIG. 11B with respect to time after the memory cell is programmed.

FIG. 13 is a graph schematically illustrating a variation in a threshold voltage of the memory cell MC shown in FIG. 11A or FIG. 11B with respect to time after the memory cell is programmed.

Referring to FIG. 13, the memory cell MC may experience sharp charge loss within a relatively short time immediately after programming. During a first duration DUR1 between a program-completed point in time and a threshold time Tth, a threshold voltage Vth of a memory cell may decrease at a relatively fast speed after programming of the memory cell is completed. After the threshold time Tth, that is, during a second duration DUR2, a threshold voltage Vth of a memory cell may decrease at a relatively slow speed. In other words, a threshold voltage Vth of a memory cell MC may decrease with a relatively great slope during the first duration DUR1 and with a relatively small slope during the second duration DUR2. For example, the threshold time Tth may be about 50 to 100 ms.

Figure 14:
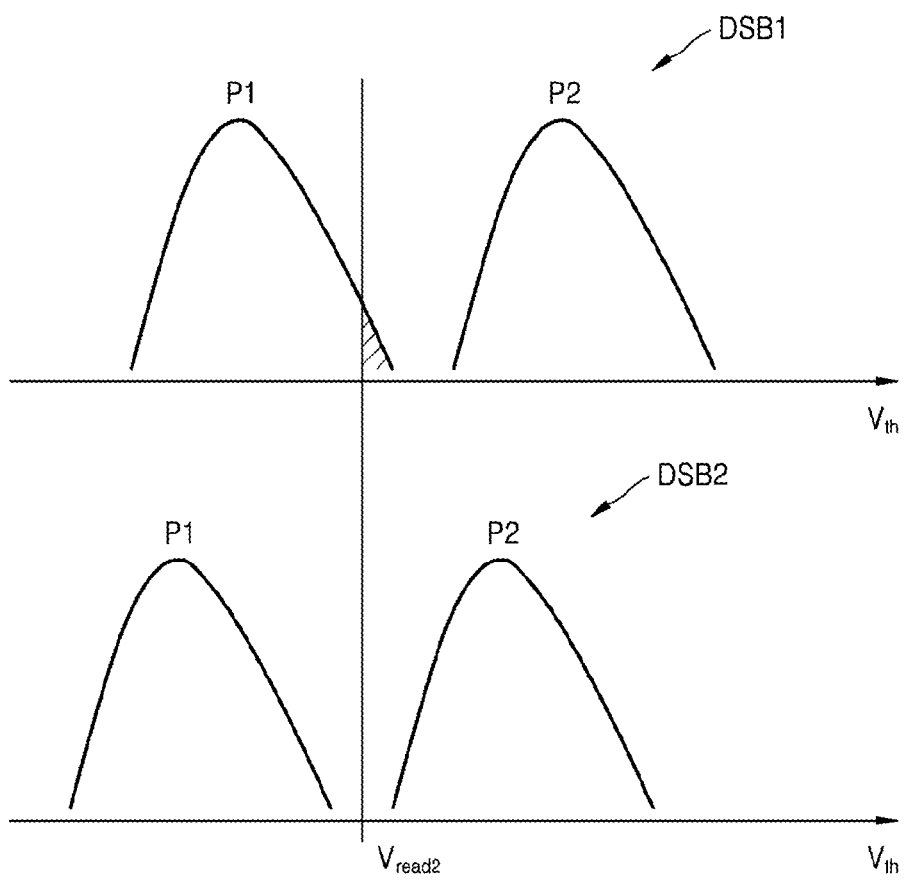
FIG. 14 is a diagram for describing a read error that occurs in the graphs shown in FIGS. 12A and 12B.

FIG. 14 is a diagram for describing a read error that occurs in the graphs shown in FIGS. 12A and 12B.

In FIG. 14, there are illustrated threshold voltage distributions corresponding to first and second program states P1 and P2 in the graph DSB1 shown in FIG. 12A and threshold voltage distributions corresponding to first and second program states P1 and P2 in the graph DSB2 shown in FIG. 12B. A read operation may be carried out without a read error when it is performed using a second read voltage Vread2 being a normal read voltage after programming of the first and second program states P1 and P2 in the graph DSB2 shown in FIG. 12B, that is, programming of memory cells MC, has ended and a time elapses.

However, a read error marked by a hashed region arises when a read operation is performed using the second read voltage Vread2 after programming of the first and second program states P1 and P2 in the graph DSB1 shown in FIG. 12A, that is, programming of memory cells MC, has ended and a time elapses. For example, even though memory cells included in the hashed region have been programmed to have a first program state P1, they are read as being in a second program state P2.

Returning to FIG. 1, the distance determination unit 22 may determine whether a distance D between a program command and a read command with respect to the same word line of a plurality of commands CMD stored in the storage unit 21 exceeds a threshold value Dth. The threshold value Dth may be determined based on a threshold time Tth shown in FIG. 13. This may mean that the distance determination unit 22 determines whether a read command is received from a host within a desired (and/or alternatively predetermined) time after a program command with respect to the same word line is received.

If a distance D between a program command and a read command with respect to the same word line exceeds the threshold value Dth, a read voltage determination unit 23 determines a normal read voltage, that is, a first voltage level, as a read voltage about the read command. If a read command is received from the host after a program command with respect to the same word line is received and a time elapses, that is, a read operation is performed after a program operation is completed and a desired (and/or alternatively predetermined) time elapses, the read operation may be performed using the normal read voltage, that is, the first voltage level.

If a distance D between a program command and a read command with respect to the same word line does not exceed the threshold value Dth, the read voltage determination unit 23 determines a special read voltage or a corrected read voltage as a read voltage about the read command. In this specification, the special read voltage or the corrected read voltage may be referred to as a second voltage level. In example embodiments, the special read voltage, that is, the second voltage level, is higher than the normal read voltage, that is, the first voltage level.

Based on the above description, a read operation may be performed using not a normal read voltage but a special read voltage immediately after programming of a memory cell MC. Thus, it is possible to solve the problem of the read error even though sharp charge loss arises immediately after programming memory cells MC.

Figure 15:
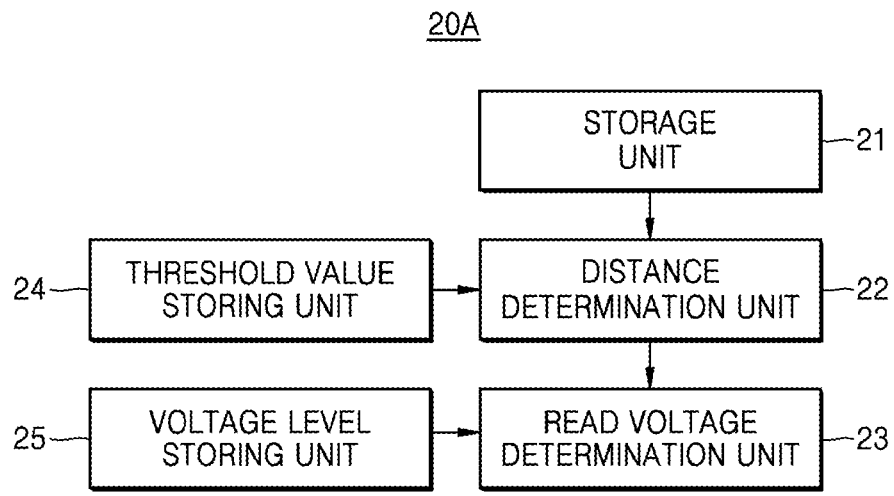
FIG. 15 is a block diagram of a memory controller shown in FIG. 1, according to example embodiments of inventive concepts.

FIG. 15 is a block diagram of a memory controller 20A as another example of the memory controller 20 shown in FIG. 1, according to example embodiments of inventive concepts.

Referring to FIG. 15, the memory controller 20A includes a storage unit 21, a distance determination unit 22, a read voltage determination unit 23, a threshold value storing unit 24, and a read level storing unit 25.

The storage unit 21 sequentially stores a plurality of commands a host provides. For example, based on an input order from the host, that is, a time sequential order, the storage unit 21 stores a plurality of commands CMD. This may be referred to as a first-in, first-out (FIFO) manner. In example embodiments, the storage unit 21 may include a command queue.

In more detail, since the storage unit 21 stores a plurality of commands CMD according to an input order from the host, a difference in a storage order between two commands CMD of the stored plurality of commands CMD, that is, a distance (or, interval), may correspond to a difference in a processing order of the two commands CMD, that is, a distance (or, interval). This may mean that a difference in a storage order between the two commands CMD, that is, a distance may correspond to a difference in a processing order of the two commands CMD, that is, a distance. Below, a storage-order distance between two commands CMD may be referred to as a distance between the two commands CMD.

Figure 16:
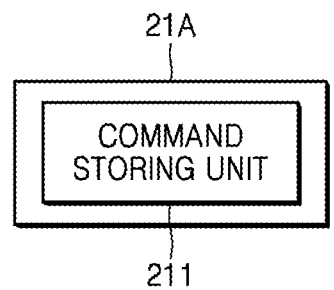
FIG. 16 is a diagram of a storage unit included in the memory controller shown in FIG. 15, according to example embodiments of inventive concepts.

FIG. 16 is a diagram of a storage unit 21A included in the memory controller 20A shown in FIG. 15, according to example embodiments of inventive concepts.

Referring to FIG. 16, the storage unit 21A includes a command storing unit 211. The command storing unit 211 sequentially stores a plurality of commands CMD received from a host. The command storing unit 211 has a desired (and/or alternatively predetermined) storage space and provides a memory device 10 with commands in such a way that a command first stored is first output and a command lastly stored is lastly output. For example, the command storing unit 211 may store 16 commands CMD. However, example embodiments of inventive concepts are not limited thereto. Modification or changes of a storage space of the command storing unit 211 may be variously made.

Figure 17:
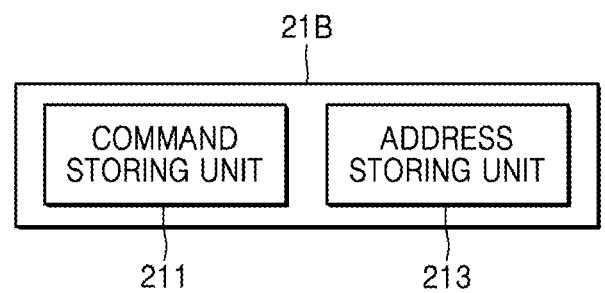
FIG. 17 is a diagram of a storage unit included in the memory controller shown in FIG. 15, according to example embodiments of inventive concepts.

FIG. 17 is a diagram of a storage unit included in the memory controller 20A shown in FIG. 15, according to example embodiments of inventive concepts.

Referring to FIG. 17, a storage unit 21B includes a command storing unit 211 and an address storing unit 213. The command storing unit 211 sequentially stores a plurality of commands CMD received from a host. The command storing unit 211 has a desired (and/or alternatively predetermined) storage space and provides a memory device 10 with commands in such a way that a command first stored is first output and a command lastly stored is lastly output. For example, the command storing unit 211 may store 16 commands CMD. However, example embodiments of inventive concepts are not limited thereto. Modification or changes of a storage space of the command storing unit 211 may be variously made.

The address storing unit 213 sequentially stores a plurality of addresses ADDR received from a host. Addresses ADDR that are sequentially stored in the address storing unit 213 may correspond to commands CMD that are sequentially stored in the command storing unit 211. The address storing unit 213 has a desired (and/or alternatively predetermined) storage space and provides a memory device 10 with addresses in such a way that an address first stored is first output and an address lastly stored is lastly output. For example, the address storing unit 213 may store 16 addresses ADDR. However, example embodiments of inventive concepts are not limited thereto. Modification or changes of a storage space of the address storing unit 213 may be variously made.

Figure 18:
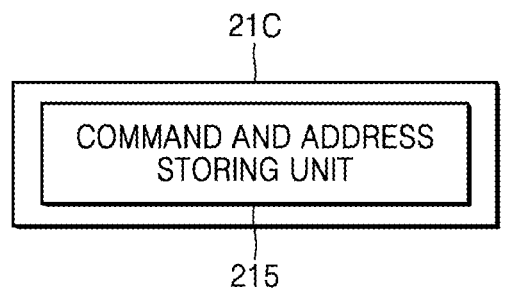
FIG. 18 is a diagram of a storage unit included in the memory controller shown in FIG. 15, according to example embodiments of inventive concepts.

FIG. 18 is a diagram of a storage unit 21C included in the memory controller 20A shown in FIG. 15, according to example embodiments of inventive concepts.

Referring to FIG. 18, the storage unit 21C includes a command and address storing unit 215. The command and address storing unit 215 sequentially stores a plurality of commands CMD and a plurality of addresses ADDR, corresponding to the commands CMD, received from a host. The command and address storing unit 215 has a desired (and/or alternatively predetermined) storage space and provides a memory device 10 with commands and addresses in such a way that a command and an address first stored are first output and a command and an address lastly stored are lastly output. For example, the command and address storing unit 215 may store 16 commands CMD and addresses ADDR. However, example embodiments of inventive concepts are not limited thereto. Modification or changes of a storage space of the command and address storing unit 215 may be variously made.

Figure 19:
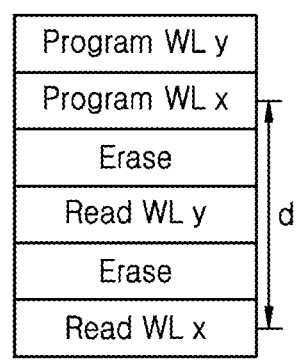
FIG. 19 is a block diagram of a storage unit included in the memory controller shown in FIG. 15, according to example embodiments of inventive concepts.
Figure 19:
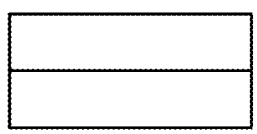

FIG. 19 is a block diagram of a storage unit 21D included in the memory controller 20A shown in FIG. 15, according to example embodiments of inventive concepts.

Referring to FIG. 19, the storage unit 21D may be implemented with a command queue with a desired (and/or alternatively predetermined) storage space. The command queue may be a list that allows a command to be received via one end and to be output via the other end. Below, the storage unit 21D may be referred to as a command queue 21D.

The command queue 21D may store a plurality of commands: a program command Program WLy about a first word line WLy, a program command Program WLx with respect to a second word line WLx, an erase command Erase, a read command Read WLy with respect to the first word line WLy, an erase command Erase, a read command Read WLx with respect to the second word line WLx, and so on. An order at which commands CMD are stored in the command queue 21D may correspond to an order at which the commands CMD are processed.

The command queue 21D may have a desired (and/or alternatively predetermined) storage space. For example, the command queue 21D may store 16 commands CMD. Commands CMD stored in the command queue 21D are provided to a memory device 10 within a relatively short time, which enables an operation corresponding to a command to be processed within a relatively short time. If a program command and a read command with respect to the same word line are included in commands CMD stored in the command queue 21D, a read operation about the same word line is performed within a relatively short time after a program operation about the same word line is carried out.

Returning to FIG. 15, the distance determination unit 22 may determine a distance (or, interval) between program and read commands, associated with the same word line, from among commands CMD stored in the storage unit 21D. For example, the distance determination unit 22 may determine whether the distance D between program and read commands with respect to the same word line exceeds a threshold value Dth. In example embodiments, the storage unit 21D may include a command queue, and the distance D may represent a command-queue interval/distance or a command-queue depth.

The threshold value storing unit 24 may be implemented with a threshold value table that is configured to store threshold values based on a plurality of program states of memory cells.

Figures 20, 21:
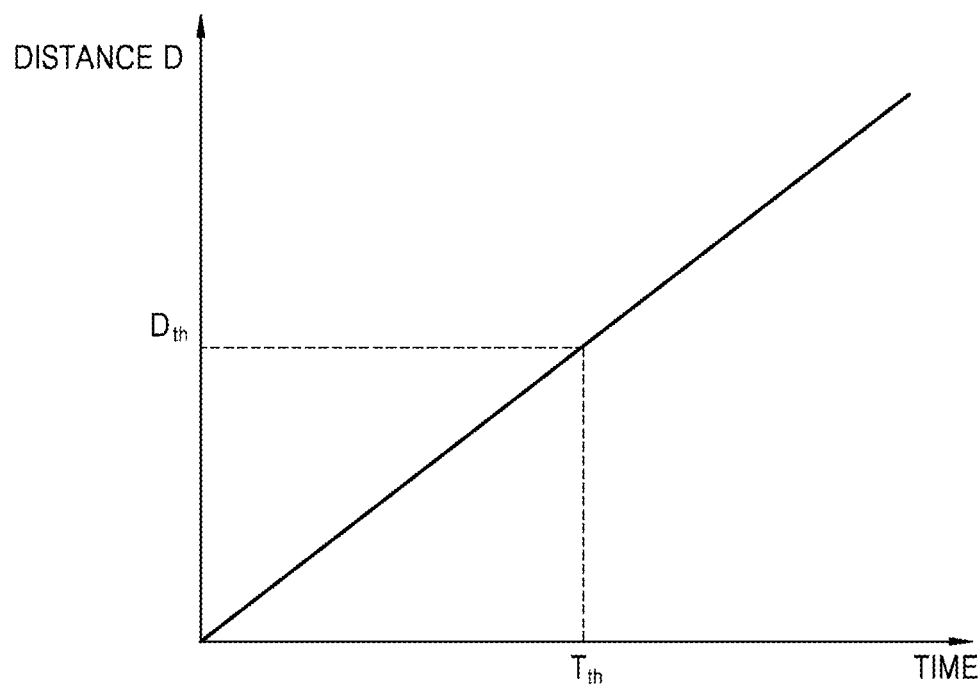
FIG. 20 is a table schematically illustrating a threshold value table stored in a threshold value storing unit shown in FIG. 15, according to example embodiments of inventive concepts.
FIG. 21 is a graph showing a command-queue distance with respect to time, according to example embodiments of inventive concepts.

FIG. 20 is a table schematically illustrating a threshold value table stored in the threshold value storing unit 24 shown in FIG. 15, according to example embodiments of inventive concepts.

Referring to FIG. 20, if a memory cell is a 2-bit multi-level cell, a threshold value table stores threshold values $\alpha$, $\beta$, and $\gamma$ based on first to third program states P1 to P3. Here, the threshold values α, β, and γ may be determined based on a speed at which a threshold voltage of a program-completed memory cell varies.

If a memory cell is a 3-bit multi-level cell, the threshold value table may store threshold values based on first to seventh program states P1 to P7. Like the above description, the threshold values may be determined based on a speed at which a threshold voltage of a program-completed memory cell varies.

FIG. 21 is a graph showing a command-queue distance with respect to time, according to example embodiments of inventive concepts.

Referring to FIG. 21, the abscissa represents a time, and the ordinate represents a command-queue distance D. As illustrated in FIG. 13, during a first duration DUR1, that is, during a time period from a program end point of time to a threshold time Tth, a threshold voltage Vth of a memory cell MC may decrease at a relatively fast speed. During a second duration DUR2, that is, after the threshold time Tth, the threshold voltage Vth of the memory cell MC may decrease at a relatively slow speed. Based on the above description, the threshold time Tth may be a boundary between the first duration DUR1 and the second duration DUR2.

It is assumed that a time taken to perform an operation corresponding to each command is the same regardless of types of commands CMD. With this assumption, the command-queue distance D may be linearly proportional to time. In example embodiments, a command-queue distance D corresponding to the threshold time Tth may be determined as a threshold value Dth.

Returning to FIG. 15, the read voltage determination unit 23 may determine the read voltage level corresponding to a read command, based on a distance D determined by the distance determination unit 22 and a voltage level stored in the voltage level storing unit 25. For example, if the distance D exceeds the threshold value Dth, the read voltage determination unit 23 determines a normal read voltage, that is, a first voltage level, as the read voltage level. Otherwise, if the distance D does not exceed the threshold value Dth, the read voltage determination unit 23 determines a special read voltage, that is, a second voltage level that is higher than the first voltage level, as the read voltage level. At this time, the read voltage determination unit 23 generates a control signal CTRL for controlling the read voltage level and thus determines and provides the control signal CTRL to a memory device 10.

Figures 22, 23:
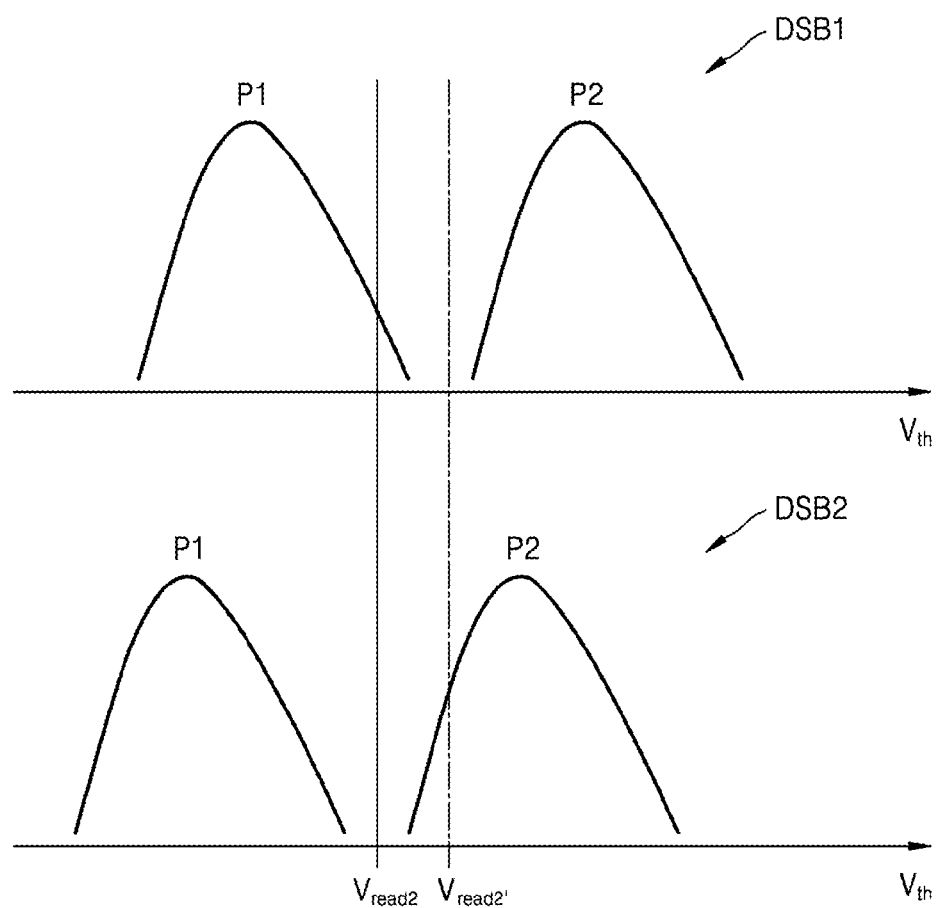
FIG. 22 shows a voltage level table stored in a storage unit shown in FIG. 15, according to example embodiments of inventive concepts.
FIG. 23 is a diagram for describing a read operation using a read voltage that is determined based on voltage levels listed in the voltage level table shown in FIG. 22, according to example embodiments of inventive concepts.

FIG. 22 shows a voltage level table stored in the storage unit 25 shown in FIG. 15, according to example embodiments of inventive concepts.

Referring to FIG. 22, if a memory cell is a 2-bit multi-level cell, a voltage level table may store normal read voltages, that is, first voltage levels corresponding to first to third program states P1 to P3, and special read voltages, that is, second voltage levels corresponding thereto. For example, in the case of the first program state P1, the first voltage Vread1 is 0.5 V and the second read voltage Vread1' is 0.7 V. In the case of the second program state P2, the first voltage Vread2 is 1.0 V and the second read voltage Vread2' is 1.2 V. In the case of the third program state P3, the first voltage Vread3 is 2.0 V and the second read voltage Vread3' is 2.3 V.

FIG. 23 is a diagram for describing a read operation using a read voltage that is determined based on voltage levels stored in the voltage level table shown in FIG. 22, according to example embodiments of inventive concepts.

Referring to FIG. 23, a first distribution DSB1 may represent threshold voltages of memory cells distributed during a first duration DUR1 between a program end time and a threshold time Tth. A second distribution DSB2 may represent threshold voltages of memory cells distributed during a second duration DUR2 after threshold time Tth, that is, after programming of memory cells is completed and a time elapses.

In example embodiments of inventive concepts, in the case of the first distribution DSB1 corresponding to the first duration DUR1, a read operation may be performed using a special read voltage, that is, a second voltage level Vread2'. In the case of the second distribution DSB2 corresponding to the second duration DUR2, a read operation may be performed using a normal read voltage, that is, a first voltage level Vread2. Thus, a read operation may be performed in the first and second durations DUR1 and DUR2 without a read error.

Figure 24:
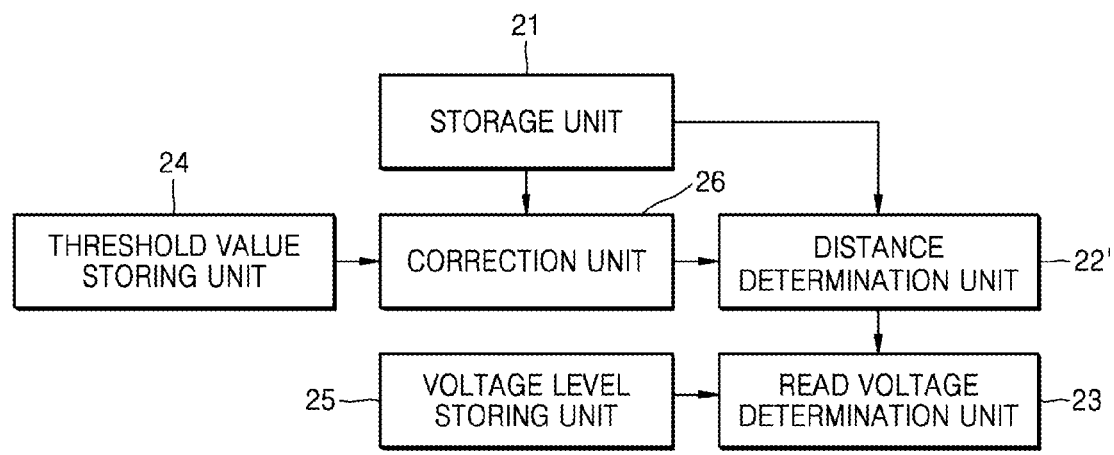
FIG. 24 is a block diagram of a memory controller as another example of a memory controller shown in FIG. 1.

FIG. 24 is a block diagram of the memory controller 20B as another example of the memory controller 20 shown in FIG. 1, according to example embodiments of inventive concepts.

Referring to FIG. 24, a memory controller 20B includes a storage unit 21, a distance determination unit 22', a read voltage determination unit 23, a threshold value storing unit 24, a voltage level storing unit 25, and a correction unit 26. As compared to the memory controller 20A shown in FIG. 15, the memory controller 20B may further include the correction unit 26. Below, a difference between the memory controllers 20A and 20B shown in FIGS. 15 and 24 will be described.

The correction unit 26 may correct a threshold value Dth based on types of commands CMD stored in the storage unit 21. A time taken to perform a command CMD may vary with a type of command. For example, a time taken to perform an erase operation according to an erase command may be longer than a time taken to perform a read operation according to a read command.

In example embodiments, the correction unit 26 may increase the threshold value Dth according to the number of erase commands of a plurality of commands CMD stored in the storage unit 21. Alternatively, the correction unit 26 may decrease the threshold value Dth according to the number of read commands of a plurality of commands CMD stored in the storage unit 21. Or, the correction unit 26 may increase the threshold value Dth according to the number of erase commands of a plurality of commands CMD stored in the storage unit 21 and may decrease the threshold value Dth according to the number of read commands of a plurality of commands CMD stored in the storage unit 21.

Figure 25:
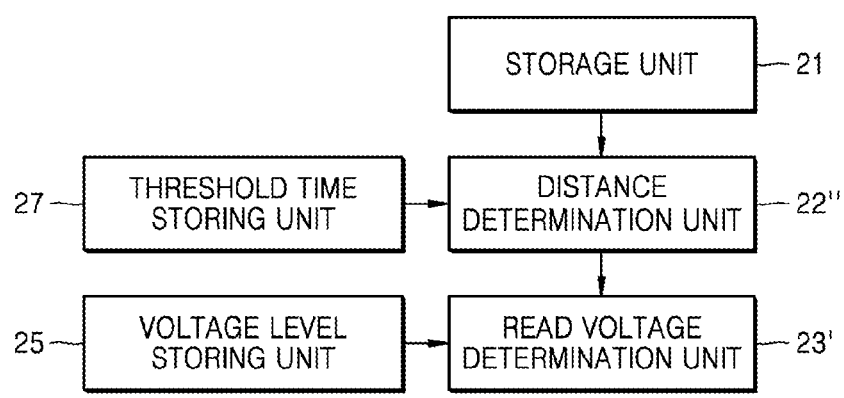
FIG. 25 is a block diagram of a memory controller as another example of the memory controller shown in FIG. 1.

FIG. 25 is a block diagram of a memory controller 20C as another example of the memory controller 20 shown in FIG. 1.

Referring to FIG. 25, the memory controller 20C includes a storage unit 21, a distance determination unit 22", a read voltage determination unit 23', and a threshold time storing unit 27. As compared the a memory controller 20A shown in FIG. 15, the memory controller 20C may further include the threshold time storing unit 27. Below, a difference between the memory controllers 20A and 20C shown in FIGS. 15 and 25 will be described.

The threshold time storing unit 27 may include a threshold time table that is configured to store threshold times Tth according to a plurality of program states of memory cells. Here, a threshold time may correspond to a threshold time Tth shown in FIG. 13.

The distance determination unit 22" counts the number of erase, read, and program commands, existing between a program command (e.g., Program WLx in FIG. 19) and a read command (e.g., Read WLx in FIG. 19) with respect to the same word line, from among a plurality of commands CMD stored in the storage unit 21. The distance determination unit 22″ estimates a first time T1 between a program command (e.g., Program WLx in FIG. 19) and a read command (e.g., Read WLx in FIG. 19) with respect to the same word line based on the counting result. Afterwards, the distance determination unit 22″ may determine whether the first time T1 exceeds a threshold time Tth.

The first time T1 may be obtained through the following equation 1:

$$T1 = Te*Ne + Tp*Np + Tr*Nr \qquad (1)$$

In Equation 1, "Te" is a time taken to execute an erase command and "Ne" is the number of erase commands. "Tp" is a time taken to execute a program command and "Np" is the number of program commands. "Tr" is a time taken to execute a read command and "Nr" is the number of read commands. A read voltage determination unit 23′ may determine a read voltage level corresponding to a read command based on a determination result of the distance determination unit 22″ and a voltage level stored in a voltage level storing unit 25. For example, the read voltage determination unit 23′ selects a normal read voltage, that is, a first voltage level, as a read voltage level when the first time T1 exceeds the threshold time Tth. The read voltage determination unit 23′ selects a special read voltage, that is, a second voltage level that is higher than the first voltage level, as a read voltage level when the first time T1 does not exceed the threshold time Tth. At this time, the read voltage determination unit 23′ generates a control signal CTRL for controlling the read voltage level and thus selects and provides the control signal CTRL to a memory device 10.

Figure 26:
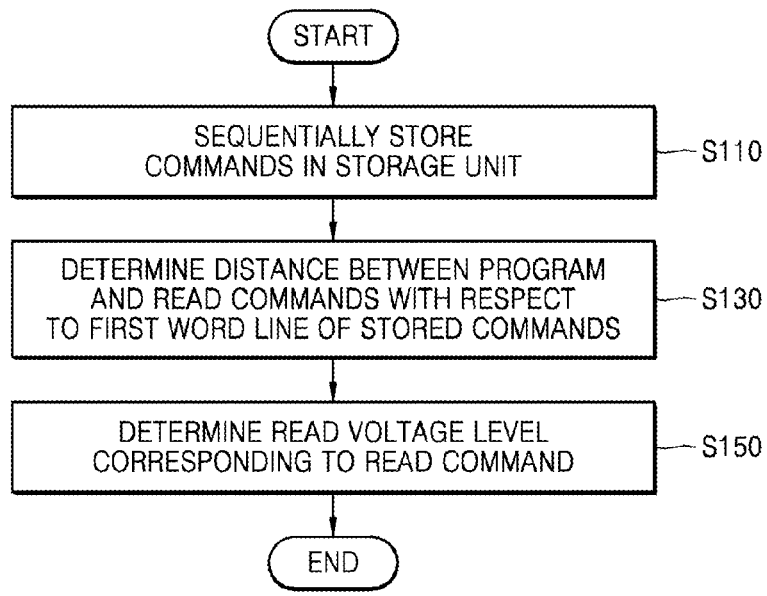
FIG. 26 is a flowchart of an operating method of a memory system, according to example embodiments of inventive concepts.

FIG. 26 is a flowchart of an operating method of a memory system, according to example embodiments of inventive concepts.

Referring to FIG. 26, an operating method of a memory system, according to example embodiments of inventive concepts, may be a method of adjusting a read voltage for a read operation with respect to a memory cell array included in a memory device and descriptions provided above with reference to FIGS. 1 to 25 apply to the operating method of a memory system, according to example embodiments of inventive concepts. The operating method of a memory system, according to example embodiments of inventive concepts, will now be described with reference to FIGS. 1 and 26.

In step S110, a plurality of commands are sequentially stored in the storage unit 21. For example, the storage unit 21 may sequentially store a plurality of commands CMD that a host provides. A difference between input orders of two commands CMD of the stored commands CMD, that is, a distance (or, interval), may correspond to a difference between processing orders of the two commands CMD, that is, a distance (or, interval).

In step S130, a distance between program and read commands, associated with a first word line, from among the stored commands is determined. For example, the distance determination unit 22 may determine a distance between program and read commands, associated with a first word line, from among the stored commands. For example, the distance determination unit 22 may determine whether the distance D between the program and read commands with respect to the first word line exceeds a threshold value Dth.

In step S150, a read voltage level corresponding to a read command is determined. For example, a read voltage determination unit 23 may determine a read voltage level corresponding to the read command with respect to the first word line, based on the determination result of the distance determination unit 22. For example, the read voltage determination unit 23 selects a normal read voltage, that is, a first voltage level, as a read voltage if the distance D between the program and read commands with respect to the first word line exceeds a threshold value Dth. The read voltage determination unit 23 selects a special read voltage, that is, a second voltage level that is higher than the first voltage level, as the read voltage if the distance D does not exceed the threshold value Dth.

Figure 27:
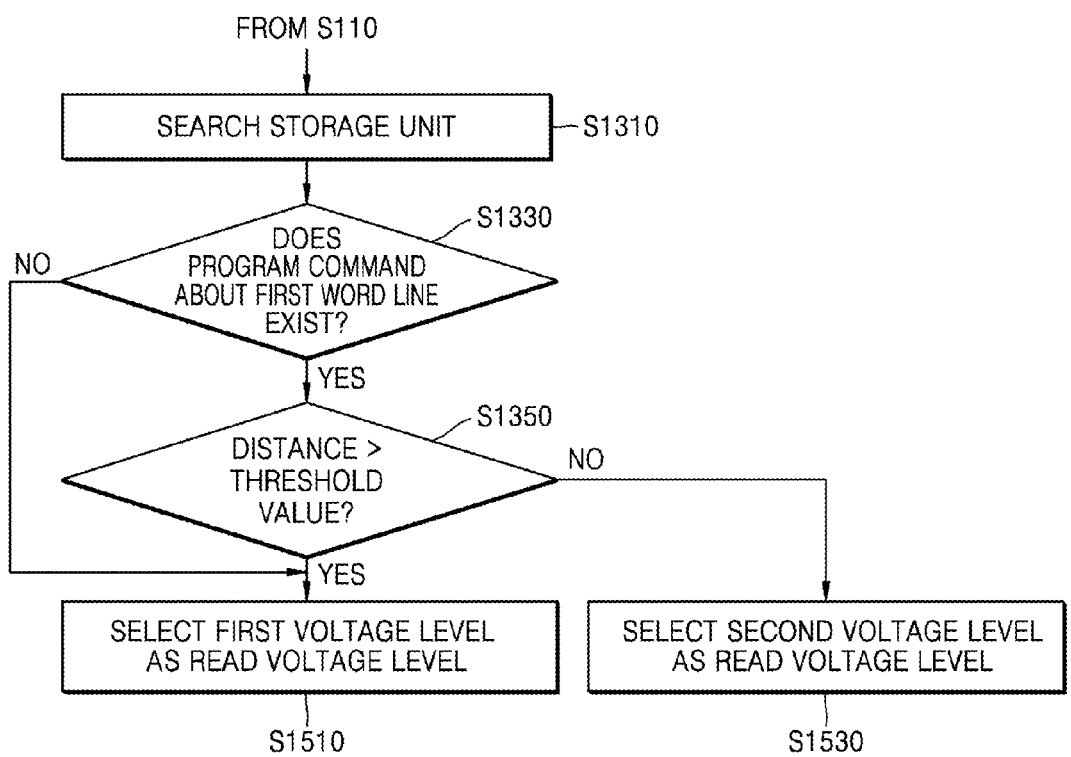
FIG. 27 is a flowchart of an operating method of a memory system, according to example embodiments of inventive concepts.

FIG. 27 is a flowchart of an operating method of a memory system, according to example embodiments of inventive concepts.

Referring to FIG. 27, the operating method of a memory system, according to example embodiments of inventive concepts, includes steps following step S110 shown in FIG. 26 and corresponds to an example of steps S130 and 150.

In step S1310, a storage unit 21 is searched. For example, the distance determination unit 22 may search for a plurality of commands CMD stored in the storage unit 21 when a read command is received.

In step S1330, whether a program command with respect to a first word line exists is determined. For example, the distance determination unit 22 may determine whether a program command with respect to the first word line exists in commands CMD stored in the storage unit 21.

If it is determined that a program command with respect to the first word line does not exist, the method proceeds to step S1510. Otherwise, if it is determined that a program command with respect to the first word line exists, it is determined whether a distance exceeds a threshold value in step S1350. For example, it may be determined whether a distance D between program and read commands with respect to the first word line exceeds a threshold value Dth. If so, the method proceeds to step S1510. If not, the method proceeds to step S1530.

In step S1510, a first voltage level may be selected as a read voltage level. For example, that the distance D exceeds the threshold value Dth may mean that a read operation is performed after programming of memory cells has ended and a time elapses. In this case, the read voltage determination unit 23 selects a normal read voltage, that is, a first voltage level, as a read voltage level.

In step S1530, a second voltage level may be selected as the read voltage level. For example, that the distance D does not exceed the threshold value Dth may mean that a read operation is performed within a time after programming of memory cells has ended. In this case, the read voltage determination unit 23 selects a special read voltage, that is, a second voltage level, as the read voltage level.

Figure 28:
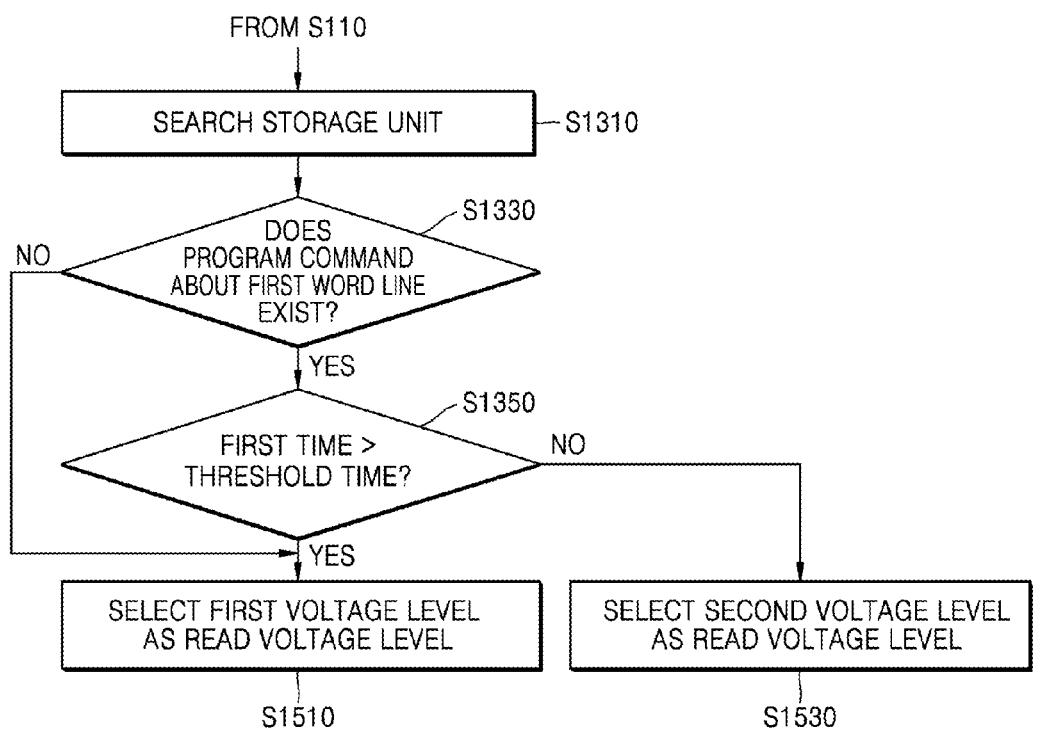
FIG. 28 is a flowchart of an operating method of a memory system, according to example embodiments of inventive concepts.

FIG. 28 is a flowchart of an operating method of a memory system, according to example embodiments of inventive concepts.

Referring to FIG. 28, the operating method of a memory system, according to example embodiments of inventive concepts, includes steps following the step S110 shown in FIG. 26 and corresponds to an example of steps S130 and 150.

In step S1310, a storage unit 21 is searched. For example, the distance determination unit 22″ may search for a plurality of commands CMD stored in the storage unit 21 when a read command is received.

In step S1330, whether a program command with respect to a first word line exists is determined. For example, the distance determination unit 22″ may determine whether a program command with respect to the first word line exists in commands CMD stored in the storage unit 21.

If it is determined that a program command with respect to the first word line exists, the method proceeds to step S1360. Otherwise, if it is determined that a program command with respect to the first word line does not exist, the method proceeds to step S1510.

In step S1360, it is determined whether a first time exceeds a threshold time. For example, it may be determined whether a first time T1 between program and read commands with respect to the first word line exceeds a threshold time Tth. If so, the method proceeds to step S1510. If not, the method proceeds to step S1530.

In step S1510, a first voltage level may be selected as a read voltage level. For example, that the first time T1 exceeds the threshold time Tth may mean that a read operation is performed after programming of memory cells has ended and a time elapses. In this case, the read voltage determination unit 23' selects a normal read voltage, that is, a first voltage level, as a read voltage level.

In step S1530, a second voltage level may be selected as the read voltage level. For example, that the first time T1 does not exceed the threshold time Tth may mean that a read operation is performed within a time after programming of memory cells has ended. In this case, the read voltage determination unit 23' selects a special read voltage, that is, a second voltage level, as the read voltage level.

Figure 29:
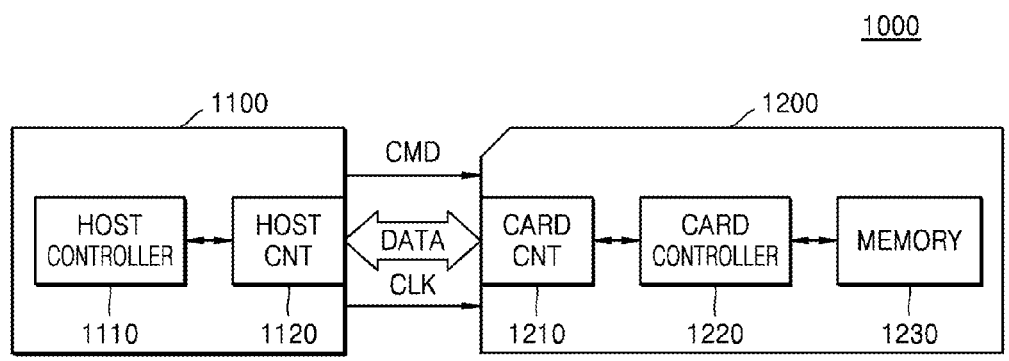
FIG. 29 is a block diagram of a memory card system including a memory system according to example embodiments of inventive concepts.

FIG. 29 is a block diagram of a memory card system 1000 including a memory system according to example embodiments of inventive concepts.

Referring to FIG. 29, the memory card system 1000 includes a host 1100 and a memory card 1200. The host 1100 includes a host controller 1110 and a host connection unit 1120. The memory card 1200 includes a card connection unit 1210, a card controller 1220, and a memory device 1230. In example embodiments, the memory card 1200 may be implemented using embodiments described with reference to FIGS. 1 to 28.

The host 1100 writes data to the memory card 1200 or reads data from the memory card 1200. The host controller 1110 provides the memory card 1200 with a command, a clock signal CLK, and data via the host connection unit 1120. Here, the clock signal CLK may be generated from a clock generator (not shown) in the host 1100.

Based on a command received via the card connection unit 1210, the card controller 1220 stores data in the memory device 1230 in synchronization with a clock signal that a clock generator (not shown) of the card controller 1220 generates. The memory device 1230 stores data transmitted from the host 1100.

The memory card 1230 may be implemented with, but not limited to, a compact flash card (CFC), a Microdrive, a smart media card (SMC), a multimedia card (MMC), a security digital card (SDC), a memory stick, or an USB flash memory driver.

Figure 30:
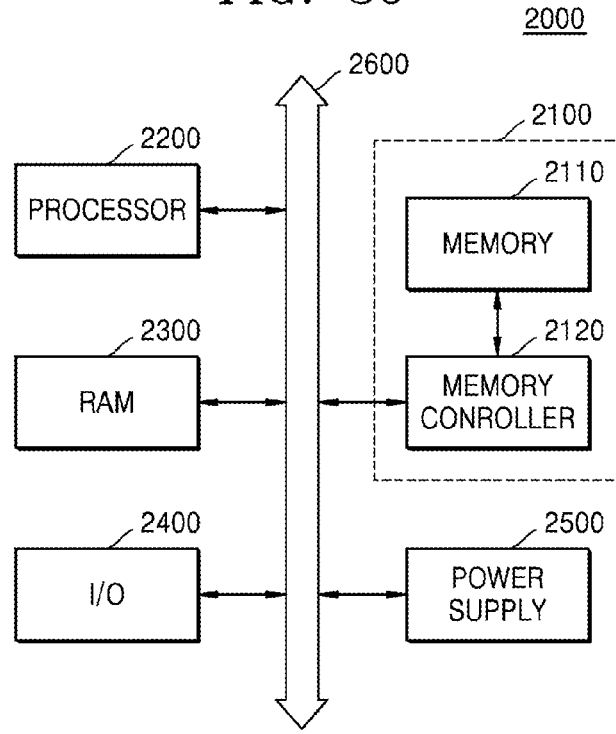
FIG. 30 is a block diagram of a computing system including a memory system according to example embodiments of inventive concepts.

FIG. 30 is a block diagram of a computing system 2000 including a memory system according to example embodiments of inventive concepts.

Referring to FIG. 30, the computing system 2000 includes a memory system 2100, a processor 2200, RAM 2300, an input/output device 2400, and a power supply 2500. Although not shown in FIG. 30, the computing system 2000 may further comprise ports for communication with a video card, a sound card, a memory card, and an USB device or with other electronic devices. The computing system 2000 may be implemented with a personal computer or with a handheld electronic device, such as a notebook computer, a mobile phone, a personal digital assistant (PDA), a camera, and so on.

The processor 220 performs specific calculations or tasks. In example embodiments, the processor 2200 may be a microprocessor or a central processing unit (CPU). The processor 2200 may communicate with the RAM 2300, the input/output device 2400, the memory system 2100 via a bus 2600 such as an address bus, a control bus, and a data bus. In example embodiments, the memory system 2100 may be implemented with embodiments described with reference to FIGS. 1 to 28.

In some embodiments, the processor 2200 may be connected to an expansion bus, such as a Peripheral Component Interconnect (PCI) bus.

The RAM 2300 stores data needed for an operation of the computing system 2000. For example, the RAM 2300 may be implemented with DRAM, mobile DRAM, SRAM, PRAM, FRAM, RRAM, and/or MRAM.

The input/output device 2400 may include an input means, such as a keyboard, a keypad, a display, and so on, and an output means, such as a printer, a display, and so on. The power supply 2500 supplies an operating voltage needed for an operation of the computing system 2000.

Figure 31:
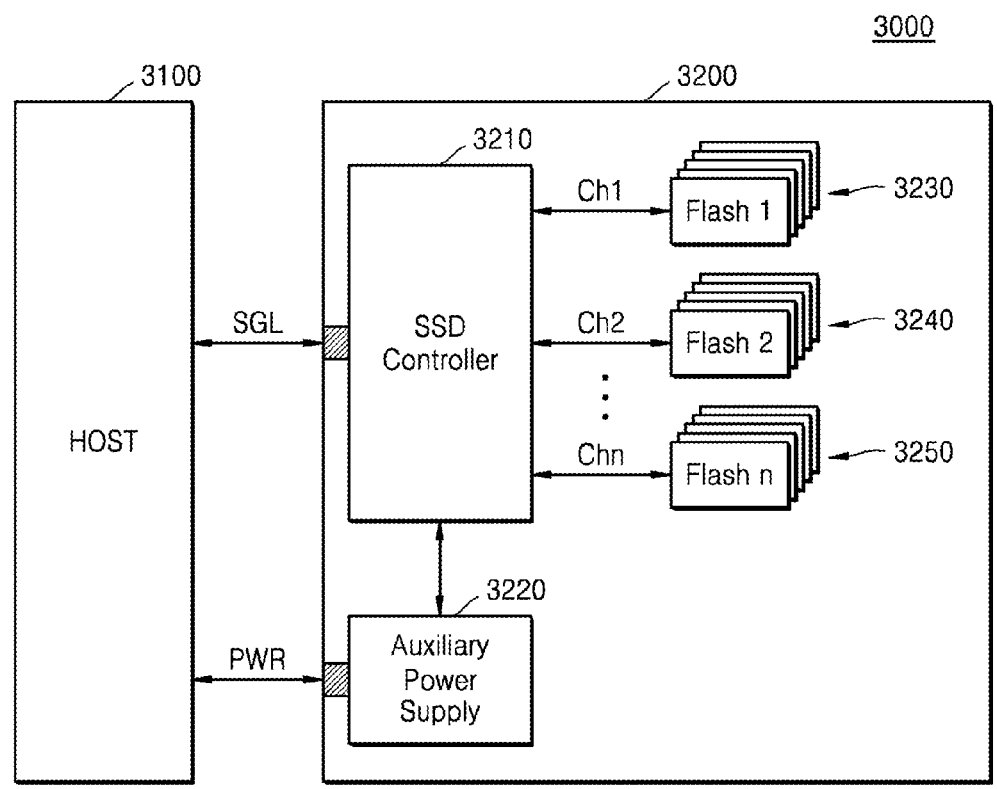
FIG. 31 is a block diagram of an SSD system including a memory system according to example embodiments of inventive concepts.

FIG. 31 is a block diagram of an SSD system 3000 including a memory system according to example embodiments of inventive concepts.

Referring to FIG. 31, the SSD system 3000 includes a host 3100 and an SSD 3200. The SSD 3200 exchanges signals with the host 3100 via a signal connector and receives power via a power connector. The SSD 3200 includes an SSD controller 3210, an auxiliary power supply 3200, and a plurality of memory devices 3230, 3240, and 3250. The SSD 3200 may be implemented using embodiments described with reference to FIGS. 1 to 28.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A memory system comprising:
   a memory device including a plurality of memory cells; and
   a memory controller configured to control the memory device,
   the memory controller including a storage unit configured to sequentially store a plurality of commands received from a host,
   the memory controller including a distance determination unit configured to determine a distance between a program command and a read command, associated with the same word line, from among the plurality of commands stored in the storage unit, and
   the memory controller including a read voltage determination unit configured to determine a read voltage level corresponding to the read command based on the determined distance.

2. The memory system of claim 1, wherein the distance determination unit is configured to determine whether the distance between the program command and the read command with respect to the same word line exceeds a threshold value.

3. The memory system of claim 2, wherein the threshold value is based on a speed at which a threshold voltage of a program-completed memory cell of the plurality of memory cells varies.

4. The memory system of claim 2, wherein
a threshold voltage of a program-completed memory cell of the plurality of memory cells decreases at a first speed during a time period between a program end time and a threshold time
the threshold voltage decreases at a second speed after the threshold time, and
the first speed is faster than the second speed.

5. The memory system of claim 4, wherein the threshold value is based on the threshold time.

6. The memory system of claim 2, wherein
the read voltage determination unit is configured to select a first voltage level as the read voltage level if the distance exceeds the threshold value, and
the read voltage determination unit is configured to select to select a second voltage level that is higher than the first voltage level as the read voltage level if the distance does not exceed the threshold value.

7. The memory system of claim 6, wherein
the first voltage level is used to read a memory cell when a variation in a threshold voltage of a program-completed memory cell of the plurality of memory cells is relatively small, and
the second voltage level is used to read the memory cell when the variation in the threshold voltage of the program-completed memory cell of the plurality of memory cells is relatively large.

8. The memory system of claim 2, further comprising:
a correction unit configured to correct the threshold value based on types of the plurality of commands stored in the storage unit.

9. The memory system of claim 8, wherein the correction unit is configured to increase the threshold value according to a number of erase commands among the plurality of commands stored in the storage unit.

10. The memory system of claim 8, wherein the correction unit is configured to decrease the threshold value according to a number of read commands among the plurality of commands stored in the storage unit.

11. The memory system of claim 2, wherein the storage unit is configured to form a command queue configured to sequentially store the plurality of commands.

12. The memory system of claim 1, wherein
the distance determination unit is configured to estimate a first time between the program command and the read command with respect to the same word line, and
the distance determination unit is configured to determine whether the first time exceeds a threshold time.

13. A memory system comprising:
a memory device including a plurality of memory cells connected to a plurality of word lines; and
a memory controller configured to control the memory device,
the memory controller being configured to sequentially store a plurality of commands received from a host,
the memory controller being configured to determine if the plurality of commands stored in the storage unit include a program command and a read command associated with a selected word line among the plurality of word lines,
the memory controller being configured to adjust a level of a read voltage applied to the selected word line during a read operation according to an interval based on the program command and the read command, and
the memory controller being configured to control the application of the read voltage to the selected word line during the read operation.

14. The memory system of claim 13, wherein
the memory controller is configured to increase a magnitude of the read voltage applied to the selected word line during the read operation from a first read voltage to a second read voltage if the interval based on the program command and the read command is less than or equal to a threshold time, and
the memory controller is configured apply the first read voltage to the selected word line during the read operation if the interval based on the program command and the read command is greater than the threshold time.

15. The memory system of claim 13, wherein
the memory controller is configured to increase a magnitude of the read voltage applied to the selected word line from a first read voltage to a second read voltage if the interval based on the program command and the read command is less than a threshold time, and
the memory controller is configured apply the first read voltage to the selected word line during the read operation if the interval based on the program command and the read command is greater than or equal to the threshold time.

16. The memory system of claim 13, wherein
the memory controller is configured to adjust the level of the read voltage applied to selected word line during the read operation based on a program state of a selected memory cell connected to the selected word line, and
the plurality of memory cells include the selected cell.

17. The memory system of claim 13, wherein
the plurality of memory cells are organized as a plurality of strings, and
each one of the plurality of strings includes several of the plurality of memory cells stacked on top of each other between at least one ground selection transistor and at least one string selection transistor.

* * * * *